(12) United States Patent
Chong

(10) Patent No.: US 12,113,091 B2
(45) Date of Patent: Oct. 8, 2024

(54) FULL COLOR LIGHT EMITTING DIODE STRUCTURE AND METHOD FOR MANUFACTURING THE SAME

(71) Applicant: Raysolve Optoelectronics (Suzhou) Company Limited, Suzhou (CN)

(72) Inventor: Wing Cheung Chong, Hong Kong (CN)

(73) Assignee: Raysolve Optoelectronics (Suzhou) Company Limited, Suzhou (CN)

( * ) Notice: Subject to any disclaimer, the term of this patent is extended or adjusted under 35 U.S.C. 154(b) by 277 days.

(21) Appl. No.: 17/244,147

(22) Filed: Apr. 29, 2021

(65) Prior Publication Data

US 2021/0351226 A1    Nov. 11, 2021

Related U.S. Application Data

(60) Provisional application No. 63/020,061, filed on May 5, 2020.

(51) Int. Cl.
*H01L 33/44* (2010.01)
*H01L 27/15* (2006.01)
(Continued)

(52) U.S. Cl.
CPC .......... *H01L 27/15* (2013.01); *H01L 33/0093* (2020.05); *H01L 33/06* (2013.01);
(Continued)

(58) Field of Classification Search
CPC ................. H01L 25/0753; H01L 27/15; H01L 2933/0016; H01L 2933/0025;
(Continued)

(56) References Cited

U.S. PATENT DOCUMENTS

2004/0129944 A1    7/2004  Chen
2005/0247950 A1    11/2005 Nakamura et al.
(Continued)

FOREIGN PATENT DOCUMENTS

CN    104752452 A    7/2015
CN    105098094 A    11/2015
(Continued)

OTHER PUBLICATIONS

International Search Report in corresponding PCT Application No. PCT/CN2021/086408 dated Jul. 8, 2021 (4 pages).
(Continued)

*Primary Examiner* — Matthew C Landau
*Assistant Examiner* — Dmitriy Yemelyanov
(74) *Attorney, Agent, or Firm* — Westbridge IP LLC

(57) ABSTRACT

A LED structure includes a substrate, a first semiconductor layer, a second semiconductor layer, and a color conversion layer. The first semiconductor layer is formed on the substrate, and the first semiconductor layer includes a first LED unit and a second LED unit formed therein. The first LED unit and the second LED unit emit light of a first color. The second semiconductor layer is formed above the first semiconductor layer, and the second semiconductor layer includes a third LED unit formed therein. The third LED unit emits light of a second color different from the first color. The color conversion layer is formed on the first LED unit to convert light of the first color to light of a third color different from the first color and the second color.

13 Claims, 25 Drawing Sheets

(51) Int. Cl.
*H01L 33/00* (2010.01)
*H01L 33/06* (2010.01)
*H01L 33/38* (2010.01)
*H01L 33/40* (2010.01)
*H01L 33/50* (2010.01)

(52) U.S. Cl.
CPC .......... *H01L 33/385* (2013.01); *H01L 33/405* (2013.01); *H01L 33/44* (2013.01); *H01L 33/50* (2013.01); *H01L 2933/0016* (2013.01); *H01L 2933/0025* (2013.01)

(58) Field of Classification Search
CPC ... H01L 33/0093; H01L 33/06; H01L 33/385; H01L 33/405; H01L 33/44; H01L 33/50
See application file for complete search history.

(56) References Cited

U.S. PATENT DOCUMENTS

| | | | |
|---|---|---|---|
| 2006/0231852 A1* | 10/2006 | Kususe | H01L 33/62 257/79 |
| 2009/0039375 A1* | 2/2009 | LeToquin | H01L 33/504 257/E33.061 |
| 2011/0275173 A1 | 11/2011 | Khaja et al. | |
| 2012/0238046 A1* | 9/2012 | Yu | H01L 33/44 438/45 |
| 2012/0248477 A1 | 10/2012 | Tischler et al. | |
| 2013/0147689 A1 | 6/2013 | Liu et al. | |
| 2014/0159007 A1 | 6/2014 | Song et al. | |
| 2014/0332779 A1 | 11/2014 | Lin | |
| 2015/0333047 A1 | 11/2015 | Pfeuffer | |
| 2017/0222100 A1* | 8/2017 | David | H01L 33/54 |
| 2019/0189679 A1 | 6/2019 | Kwak et al. | |
| 2020/0321390 A1 | 10/2020 | Wu et al. | |
| 2021/0351226 A1* | 11/2021 | Chong | H01L 33/405 |
| 2022/0246670 A1* | 8/2022 | Chen | H01L 25/0756 |

FOREIGN PATENT DOCUMENTS

| | | |
|---|---|---|
| CN | 110379938 A | 10/2019 |
| CN | 110957399 A | 4/2020 |
| JP | 10319877 A | 12/1998 |
| JP | 2004214592 A | 7/2004 |
| JP | 2011519162 A | 6/2011 |
| JP | 2013515366 A | 5/2013 |
| JP | 2013536583 A | 9/2013 |
| JP | 201818994 A | 2/2018 |
| JP | 2019530234 A | 10/2019 |
| JP | 2022539712 A | 9/2022 |
| WO | 2019125306 A1 | 6/2019 |
| WO | 2019135589 A1 | 7/2019 |

OTHER PUBLICATIONS

Japanese Office Action in related EP application No. 2022-556689 dated Aug. 8, 2023 (3 pages).
European Search Report in related EP Application No. 21799488.8 dated Aug. 10, 2023 (8 pages).
Office Action in related Japanese Patent Application No. 2022-556689, dated Nov. 17, 2023 (6 Pages).

* cited by examiner

600

700

800

FULL COLOR LIGHT EMITTING DIODE STRUCTURE AND METHOD FOR MANUFACTURING THE SAME

CROSS-REFERENCE TO RELATED APPLICATION

This application claims the benefit of priority of U.S. Provisional Application No. 63/020,061, filed on May 5, 2020, entitled "Full color micro-LED micro-display," the content of which is incorporated herein by reference in its entirety.

TECHNICAL FIELD

The present disclosure relates to a light emitting diode (LED) structure and a method for manufacturing the LED structure, and more particularly, to a full color LED structure and the method for manufacturing the same.

BACKGROUND

In the recent years, LEDs have become popular in lighting applications. As light sources, LEDs have many advantages including higher light efficiency, lower energy consumption, longer lifetime, smaller size, and faster switching.

Displays having micro-scale LEDs are known as micro-LED. Micro-LED displays have arrays of micro-LEDs forming the individual pixel elements. A pixel may be a minute area of illumination on a display screen, one of many from which an image is composed. In other words, pixels may be small discrete elements that together constitute an image as on a display. Pixels are normally arranged in a two-dimensional (2D) matrix, and are represented using dots, squares, rectangles, or other shapes. Pixels may be the basic building blocks of a display or digital image and with geometric coordinates.

When forming a full color image, a pixel might be composed of multiple sub-pixels emitting light of different colors, and each sub-pixel might be controlled or driven to emit light of different colors. When manufacturing the full color LED display, the sub-pixels emitting light of different colors are fabricated separately because the manufacturing processes or materials of LEDs having different colors are different as well. The sub-pixels are then integrated to form the full color pixel. However, the integration of multiple sub-pixel LEDs to form the full color pixel is difficult in the manufacturing process, and the problem is even more significant when the micro-LED mesas become even smaller. The integration of multiple micro-LEDs on the same platform via mass transfer method is nearly impossible for high resolution micro-display.

Embodiments of the disclosure address the above problems by providing a full color LED structure and the method for manufacturing the same, and therefore multiple sub-pixels emitting different colors can be integrated on the same platform without the drawbacks of mass transfer.

SUMMARY

Embodiments of the LED structure and method for forming the LED structure are disclosed herein.

In one example, a LED structure is disclosed. The LED structure includes a substrate, a first semiconductor layer, a second semiconductor layer, and a color conversion layer. The first semiconductor layer is formed on the substrate, and the first semiconductor layer includes a first LED unit and a second LED unit formed therein. The first LED unit and the second LED unit emit light of a first color. The second semiconductor layer is formed above the first semiconductor layer, and the second semiconductor layer includes a third LED unit formed therein. The third LED unit emits light of a second color different from the first color. The color conversion layer is formed on the first LED unit to convert light of the first color to light of a third color different from the first color and the second color.

In another example, a LED structure is disclosed. The LED structure includes a substrate and a plurality of LED units formed on the substrate. Each LED unit includes a first doping semiconductor layer, a multiple quantum well (MQW) layer formed on the first doping semiconductor layer, and a second doping semiconductor layer formed on the MQW layer. The plurality of LED units include a first LED unit and a second LED unit formed on the substrate and horizontally adjacent to each other. The second doping semiconductor layer of the first LED unit is electrically isolated with the second doping semiconductor layer of the second LED unit by an ion-implanted material formed above the first doping semiconductor layer and the MQW layer. The plurality of LED units further includes a third LED unit formed above the ion-implanted material.

In a further example, a method for manufacturing a LED structure is disclosed. A first semiconductor layer is formed on a first substrate. The first semiconductor layer includes a first doping semiconductor layer, a first multiple quantum well (MQW) layer on the first doping semiconductor layer, and a second doping semiconductor layer on the first MQW layer. A first implantation operation is performed to form a first implanted region and a first non-implanted region in the second doping semiconductor layer. A second semiconductor layer is formed on the first semiconductor layer. The second semiconductor layer includes a third doping semiconductor layer, a second MQW layer on the third doping semiconductor layer, and a fourth doping semiconductor layer on the second MQW layer. A second implantation operation is performed to form a second implanted region and a second non-implanted region in the fourth doping semiconductor layer. A first etch operation is performed to remove a portion of the second semiconductor layer and expose at least the first non-implanted region in the second doping semiconductor layer. A second etch operation is performed to expose a plurality of contacts of a driving circuit formed in the first substrate. The first non-implanted region in the second doping semiconductor layer and the second non-implanted region in the fourth doping semiconductor layer are electrically connected with the plurality of contacts.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

Figure 1:
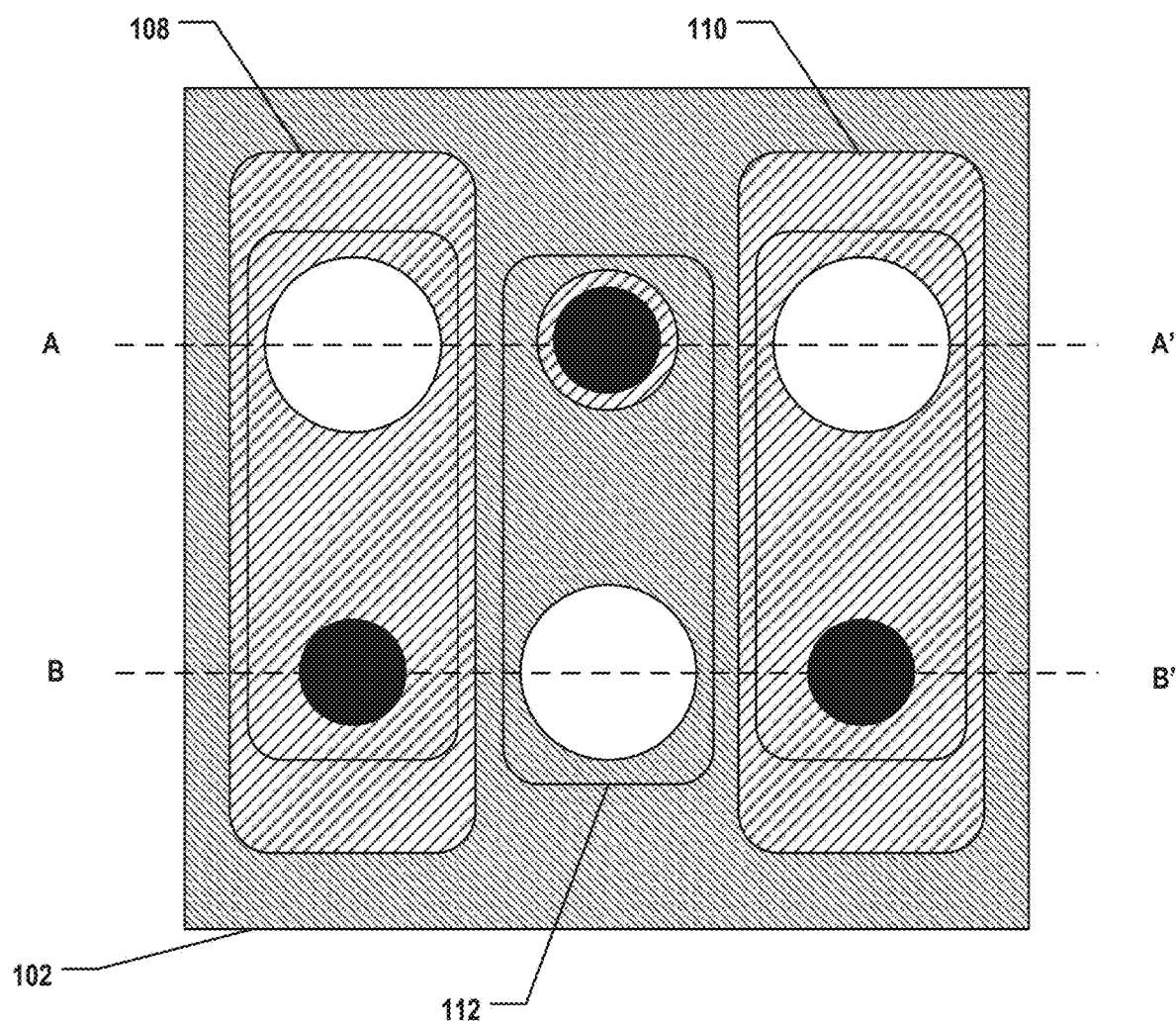
FIG. 1 illustrates a top view of an exemplary LED structure, according to some implementations of the present disclosure.

Implementations of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, a semiconductor layer can include one or more doped or undoped semiconductor layers and may have the same or different materials.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, silicon carbide, gallium nitride, germanium, gallium arsenide, indium phosphide, etc. Alternatively, the substrate can be made from an electrically non-conductive material, such as a glass, a plastic, or a sapphire wafer. Further alternatively, the substrate can have semiconductor devices or circuits formed therein.

As used herein, the term "micro" LED, "micro" p-n diode or "micro" device refers to the descriptive size of certain devices or structures according to implementations of the invention. As used herein, the terms "micro" devices or structures are meant to refer to the scale of 0.1 to 100 μm. However, it is to be appreciated that implementations of the present invention are not necessarily so limited, and that certain aspects of the implementations may be applicable to larger, and possibly smaller size scales.

Implementations of the present disclosure describe a full color LED structure or a full color micro-LED structure and a method for manufacturing the structure. For manufacturing a full color micro-LED display, multiple sub-pixels with different emitting colors, e.g., red, green, and blue, are integrally formed and become a full color pixel. The sub-pixel micro-LEDs are individually driven by one or more driving circuits to separately emit primary colors with corresponding color scales, and the human eyes can see a full range of colors of the full color pixel composed of multiple sub-pixels.

To integrally form the multiple sub-pixel LEDs or micro-LEDs emitting different colors, e.g., three primary colors, on the same substrate, a stacking structure of LED units is disclosed, and the LED units include a substantially flat top surface to achieve the stacking structure. The two layers of LED unit emits two different colors. Furthermore, a color conversion layer is deposited on one of the LED unit in the first layer to convert the emitting color of the LED unit to a third different color.

Figure 2A:
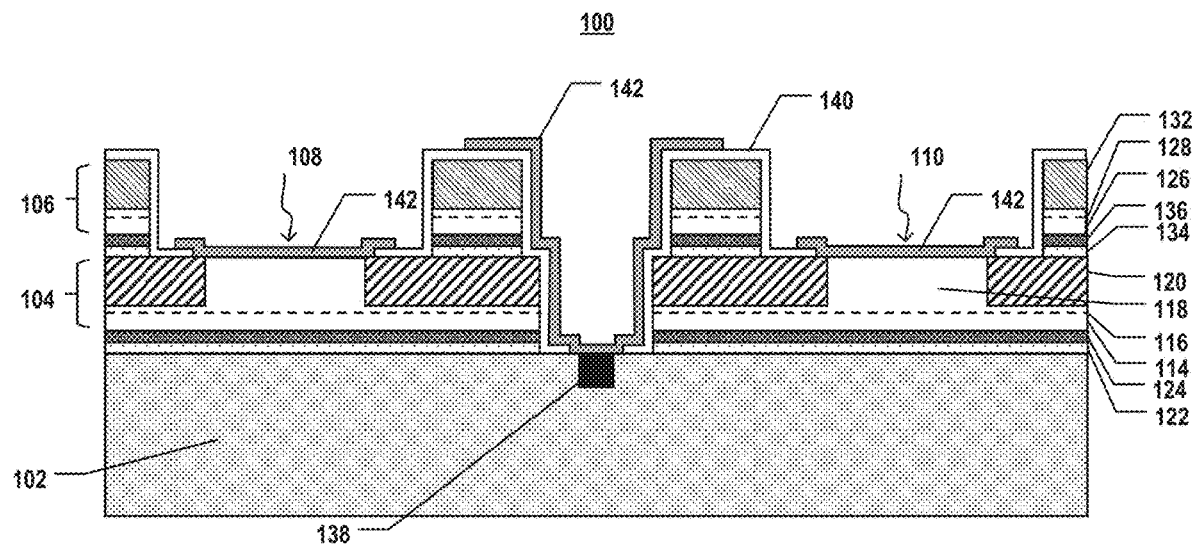
FIGS. 2A-2B illustrate cross sections of an exemplary LED structure, according to some implementations of the present disclosure.
Figure 2B:
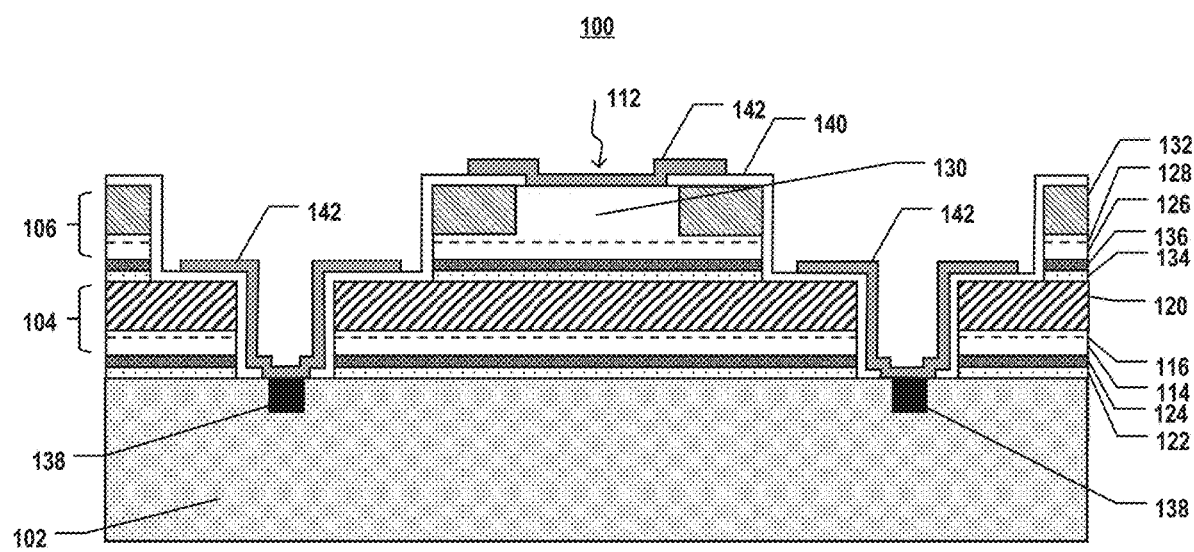

FIG. 1 illustrates a top view of an exemplary LED structure 100, according to some implementations of the present disclosure. FIG. 2A illustrates a cross section of LED structure 100 along line A-A', and FIG. 2B illustrates a cross section of LED structure 100 along line B-B', according to some implementations of the present disclosure. For the purpose of better explaining the present disclosure, the top view of LED structure 100 in FIG. 1 and the cross sections of LED structure 100 in FIGS. 2A-2B will be described together.

As shown in FIGS. 1 and 2A-2B, LED structure 100 includes a first substrate 102, a first semiconductor layer 104 formed on first substrate 102, and a second semiconductor layer 106 formed on first semiconductor layer 104. First semiconductor layer 104 includes a first LED unit 108 and a second LED unit 110, and second semiconductor layer 106 includes a third LED unit 112. First LED unit 108 and second LED unit 110 are at the same horizontal level and are horizontally adjacent to each other. Third LED unit 112 is formed in second semiconductor layer 106 above first LED unit 108 and second LED unit 110.

First substrate 102 may include a semiconductor material, such as silicon, silicon carbide, gallium nitride, germanium, gallium arsenide, or indium phosphide. In some implementations, first substrate 102 may be made from an electrically non-conductive material, such as a glass, a plastic or a sapphire wafer. In some implementations, first substrate 102 may have driving circuits formed therein, and first substrate 102 may be CMOS backplane or TFT glass substrate. The driving circuit provides the electronic signals to LED structure 100 to control the luminance. In some implementations, the driving circuit may include an active matrix driving circuit, in which each individual LED unit corresponds to an independent driver. In some implementations, the driving circuit may include a passive matrix driving circuit, in which the LED units are aligned in an array and are connected to the data lines and the scan lines driven by the driving circuit.

First semiconductor layer 104 includes a first doping semiconductor layer 114, a first multiple quantum well (MQW) layer 116 formed on first doping semiconductor layer 114, and a second doping semiconductor layer 118 formed on first MQW layer 116. In some implementations, first doping semiconductor layer 114 and second doping semiconductor layer 118 may include one or more layers formed with IT-VI materials, such as ZnSe or ZnO, or III-V nitride materials, such as GaN, AlN, InN, InGaN, GaP, AlInGaP, AlGaAs, and their alloys. In some implementations, first doping semiconductor layer 114 may be a p-type semiconductor layer that extends across first LED unit 108 and second LED unit 110 and forms a common anode of first LED unit 108 and second LED unit 110. In some implementations, first doping semiconductor layer 114 may include p-type GaN. In some implementations, first doping semiconductor layer 114 may be formed by doping magnesium (Mg) in GaN. In some implementations, first doping semiconductor layer 114 may include p-type InGaN. In some implementations, first doping semiconductor layer 114 may include p-type AlInGaP.

By having a thin layer of continuous first doping semiconductor layer 114 across multiple LED units, e.g., first LED unit 108 and second LED unit 110, the bonding area between first substrate 102 and the plurality of LED units is extended. Hence, the bonding strength between first substrate 102 and the plurality of LED units is increased and the risk of peeling-off of LED structure 100 can be reduced.

In some implementations, second doping semiconductor layer 118 may be a n-type semiconductor layer and form a cathode of first LED unit 108 and second LED unit 110. In some implementations, second doping semiconductor layer 118 may include n-type GaN. In some implementations, second doping semiconductor layer 118 may include n-type InGaN. In some implementations, second doping semiconductor layer 118 may include n-type AlInGaP. Second doping semiconductor layer 118 of different LED units, e.g., first LED unit 108 and second LED unit 110, are electrically isolated, thus each LED unit having a cathode that can have a voltage level different from the other units. First LED unit 108 and second LED unit 110 further include first MQW layer 116 formed between first doping semiconductor layer 114 and second doping semiconductor layer 118. First MQW layer 116 is the active region of first LED unit 108 and second LED unit 110.

As a result of the disclosed implementations, first LED unit 108 and second LED unit 110 are formed with their first doping semiconductor layer 114 horizontally extended across the adjacent LED units, and their second doping semiconductor layers 118 electrically isolated between the adjacent LED units. Second doping semiconductor layers 118 of first LED unit 108 and second LED unit 110 are isolated by implanted regions in a first ion-implanted material 120. Non-implanted regions of first ion-implanted material 120 may also define the light emitting area of first LED unit 108 and second LED unit 110. In some implementations, first ion-implanted material 120 may be formed by implanting ion materials in second doping semiconductor layers 118. In some implementations, first ion-implanted material 120 may be formed by implanting $H^+$, $He^+$, $N^+$, $O^+$, $F^+$, $Mg^+$, $Si^+$ or $Ar^+$ ions in second doping semiconductor layers 118. In some implementations, second doping semiconductor layers 118 may be implanted with one or more ion materials to form first ion-implanted material 120. First ion-implanted material 120 has the physical properties of electrical insulation. By implanting an ion material in a defined area of second doping semiconductor layer 118, the material of second doping semiconductor layers 118 in the defined area may be transformed to first ion-implanted material 120, which electrically isolates second doping semiconductor layers 118 of first LED unit 108 and second LED unit 110 from each other.

In some implementations, the implantation depth of first ion-implanted material 120 may be controlled to stop above first MQW layer 116, as shown in FIGS. 2A-2B. In some implementations, the implantation depth of first ion-implanted material 120 may be controlled to not penetrate first MQW layer 116 and first ion-implanted material 120 stops short to contact first doping semiconductor layer 114. It is understood that the location, shape, and depth of first ion-implanted material 120 shown in FIGS. 2A-2B are merely illustrative and are not limiting, and those skilled in the art can change according to requirements, all of which are within the scope of the present application.

First semiconductor layer 104 may be bonded to first substrate 102 through a first bonding layer 122, as shown in FIGS. 2A-2B. First bonding layer 122 is a layer of an adhesive material formed on first substrate 102 to bond first substrate 102 and first semiconductor layer 104. In some implementations, first bonding layer 122 may include a conductive material, such as metal or metal alloy. In some implementations, first bonding layer 122 may include Au, Sn, In, Cu or Ti. In some implementations, first bonding layer 122 may include a non-conductive material, such as polyimide (PI), polvdimethylsiloxane (PDMS). In some implementations, first bonding layer 122 may include a photoresist, such as SU-8 photoresist. In some implementations, first bonding layer 122 may be hydrogen silsesquioxane (HSQ) or divinylsiloxane-bis-benzocyclobutene (DVS-BCB). It is understood that the descriptions of the material of first bonding layer 122 are merely illustrative and are not limiting, and those skilled in the art can make changes according to requirements, all of which are within the scope of the present application.

LED structure 100 may further include a first reflective layer 124 formed between first semiconductor layer 104 and first bonding layer 122. First reflective layer 124 is formed on first bonding layer 122. In some implementations, first reflective layer 124 may include a reflective p-type Ohmic contact layer. First reflective layer 124 may provide a current conduction from first LED unit 108 and second LED unit 110 to first bonding layer 122. First reflective layer 124 may also function as a metal mirror to reflect the light emitted by first LED unit 108 and second LED unit 110. In some implementations, first reflective layer 124 may be a metal or metal alloy layer having a high reflectivity, e.g., silver, aluminum, gold, and their alloys. It is understood that the descriptions of the material of first reflective layer 124 are merely illustrative and are not limiting, and other materials are also contemplated, all of which are within the scope of the present application.

Second semiconductor layer 106 is formed above first semiconductor layer 104. Second semiconductor layer 106 includes a third doping semiconductor layer 126, a second MQW layer 128 formed on third doping semiconductor layer 126, and a fourth doping semiconductor layer 130 formed on second MQW layer 128.

In some implementations, third doping semiconductor layer 126 and fourth doping semiconductor layer 130 may include one or more layers formed with II-VI materials, such as ZnSe or ZnO, or III-V nitride materials, such as GaN, AlN, InN, InGaN, GaP, AlInGaP, AlGaAs, and their alloys. In some implementations, third doping semiconductor layer 126 may be a p-type semiconductor layer. In some implementations, third doping semiconductor layer 126 may include p-type GaN. In some implementations, third doping semiconductor layer 126 may be formed by doping magnesium (Mg) in GaN. In some implementations, third doping semiconductor layer 126 may include p-type InGaN. In some implementations, third doping semiconductor layer 126 may include p-type AlInGaP.

In some implementations, fourth doping semiconductor layer 130 may be a n-type semiconductor layer and form a cathode of third LED unit 112. In some implementations, fourth doping semiconductor layer 130 may include n-type GaN. In some implementations, fourth doping semiconductor layer 130 may include n-type InGaN. In some implementations, fourth doping semiconductor layer 130 may include n-type AlInGaP. Third LED unit 112 further includes second MQW layer 128 formed between third doping semiconductor layer 126 and fourth doping semiconductor layer 130. Second MQW layer 128 is the active region of third LED unit 112.

A second ion-implanted material 132 may be formed in fourth doping semiconductor layers 130 of third LED unit 112 to define the light emitting area of third LED unit 112. In some implementations, second ion-implanted material 132 may be formed by implanting ion materials in fourth doping semiconductor layers 130. In some implementations, second ion-implanted material 132 may be formed by implanting $H^+$, $He^+$, $N^+$, $O^+$, $F^+$, $Mg^+$, $Si^+$ or $Ar^+$ ions in fourth doping semiconductor layers 130. In some implementations, fourth doping semiconductor layers 130 may be implanted with one or more ion materials to form second ion-implanted material 132. Second ion-implanted material 132 has the physical properties of electrical insulation. By implanting ion material in a defined area of fourth doping semiconductor layer 130, the material of fourth doping semiconductor layers 130 in the defined area may be transformed to second ion-implanted material 132.

In some implementations, the implantation depth of second ion-implanted material 132 may be controlled above second MQW layer 128, as shown in FIGS. 2A-2B. In some implementations, the implantation depth of second ion-implanted material 132 may be controlled to not penetrate second MQW layer 128 and second ion-implanted material 132 stops short to contact third doping semiconductor layer 126. It is understood that the location, shape, and depth of second ion-implanted material 132 shown in FIGS. 2A-2B are merely illustrative and are not limiting, and those skilled in the art can make changes according to requirements, all of which are within the scope of the present application.

Second semiconductor layer 106 may be bonded to first semiconductor layer 104 through a second bonding layer 134, as shown in FIGS. 2A-2B. Second bonding layer 134 is a layer of an adhesive material formed on first semiconductor layer 104 to bond second semiconductor layer 106 and first semiconductor layer 104. In some implementations, second bonding layer 134 may include a conductive material, such as metal or metal alloy. In some implementations, second bonding layer 134 may include Au, Sn, In, Cu or Ti. In some implementations, second bonding layer 134 may include a non-conductive material, such as polyimide (PI), polydimethylsiloxane (PDMS). In some implementations, second bonding layer 134 may include a photoresist, such as SU-8 photoresist. In some implementations, second bonding layer 134 may be hydrogen silsesquioxane (HSQ) or divinylsiloxane-bis-benzocyclobutene (DVS-BCB). It is understood that the descriptions of the material of first bonding layer 122 are merely illustrative and are not limiting, and those skilled in the art can make changes according to requirements, all of which are within the scope of the present application.

LED structure 100 may further include a second reflective layer 136 formed between second semiconductor layer 106 and second bonding layer 134. Second reflective layer 136 is formed on second bonding layer 134. In some implementations, second reflective layer 136 may include a reflective p-type Ohmic contact layer. Second reflective layer 136 may provide a current conduction from third LED unit 112 to second bonding layer 134. Second reflective layer 136 may also function as a metal mirror to reflect the light emitted by third LED unit 112. In some implementations, second reflective layer 136 may be a metal or metal alloy layer having a high reflectivity, e.g., silver, aluminum, gold, and their alloys. It is understood that the descriptions of the material of second reflective layer 136 are merely illustrative and are not limiting, and other materials are also contemplated, all of which are within the scope of the present application.

As shown in FIGS. 2A and 2B, a portion of second semiconductor layer 106 is removed to expose the light emitting area (second doping semiconductor layer 118) of first LED unit 108 and second LED unit 110. Furthermore, another portion of first semiconductor layer 104 and second semiconductor layer 106 is removed to expose the contacts 138 of the driving circuit. A passivation layer 140 is formed covering first semiconductor layer 104 and second semiconductor layer 106 and expose second doping semiconductor layer 118, fourth doping semiconductor layer 130, and contacts 138. In some implementations, passivation layer 140 may include $SiO_2$, $Al_2O_3$, SiN or other suitable materials. In some implementations, passivation layer 140 may include polyimide, SU-8 photoresist, or other photo-patternable polymer. An electrode layer is formed to electrically connect second doping semiconductor layer 118 with contact 138, and fourth doping semiconductor layer 130 with contact 138. In some implementations, electrode layer 142 may be conductive materials, such as indium tin oxide (ITO), Cr, Ti, Pt, Au, Al, Cu, Ge or Ni.

By using first ion-implanted material 120 to isolate first LED unit 108 and second LED unit 110 and define the light emitting area of first LED unit 108 and second LED unit 110, the top surface of the light emitting area (second doping semiconductor layer 118) and the non-light emitting area (first ion-implanted material 120) can be formed coplanar, and the top surface of first semiconductor layer 104 may be kept substantially flat as well. Hence second semiconductor layer 106 could be formed or bonded on first semiconductor layer 104.

By using different materials to form first semiconductor layer 104 and second semiconductor layer 106, first LED unit 108 and second LED unit 110 can be manufactured to emit light of a first color, and third LED unit 112 can be manufactured to emit light of a second color. For example, by using InGaN or doping magnesium (Mg) in GaN to form first semiconductor layer 104, first LED unit 108 and second LED unit 110 may emit blue light. For another example, by using InGaN with higher indium composition to form second semiconductor layer 106, third LED unit 112 may emit green light.

Implementations of the present disclosure include the staking structure of first semiconductor layer 104 and second semiconductor layer 106, and first semiconductor layer 104 and second semiconductor layer 106 may be formed by different materials to manufacture LED units emitting light of different colors. Hence, LED structure 100 can achieve light emission of different colors by multiple LED units while avoiding the drawbacks of mass transfer.

Figure 3:
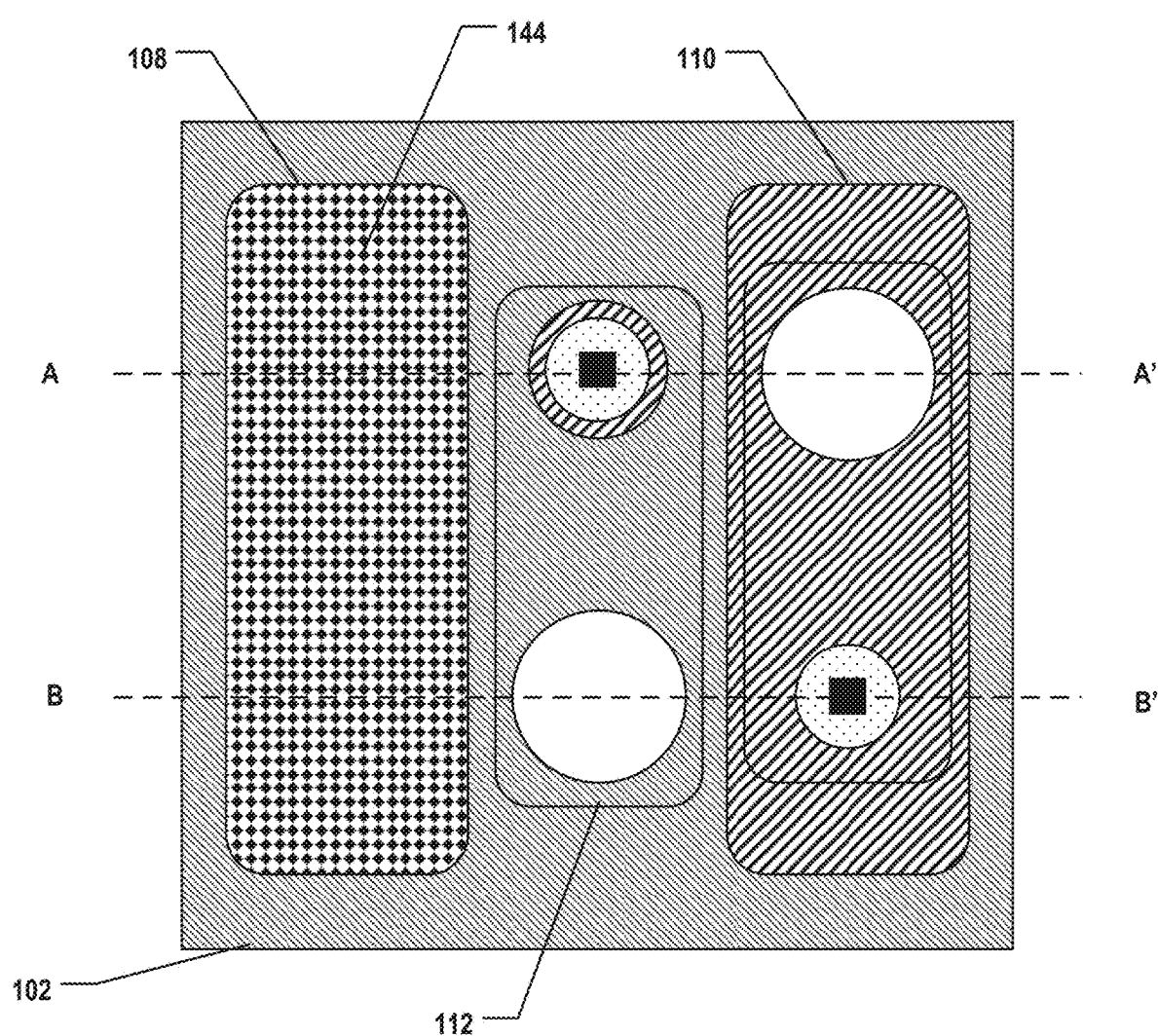
FIG. 3 illustrates a top view of another exemplary LED structure, according to some implementations of the present disclosure.
Figure 4A:
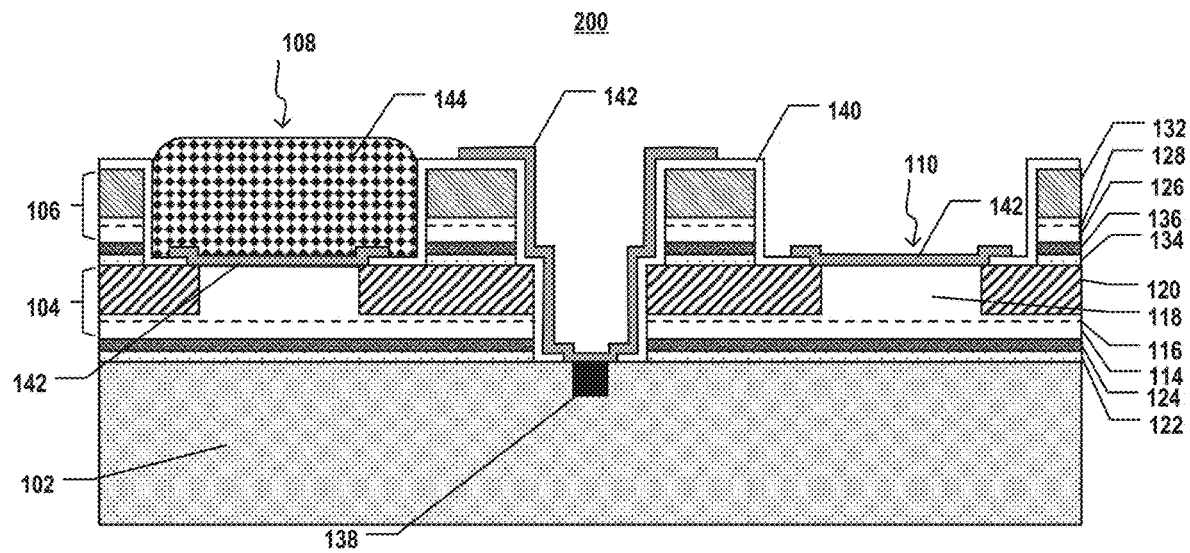
FIGS. 4A-4B illustrate cross sections of another exemplary LED structure, according to some implementations of the present disclosure.
Figure 4B:
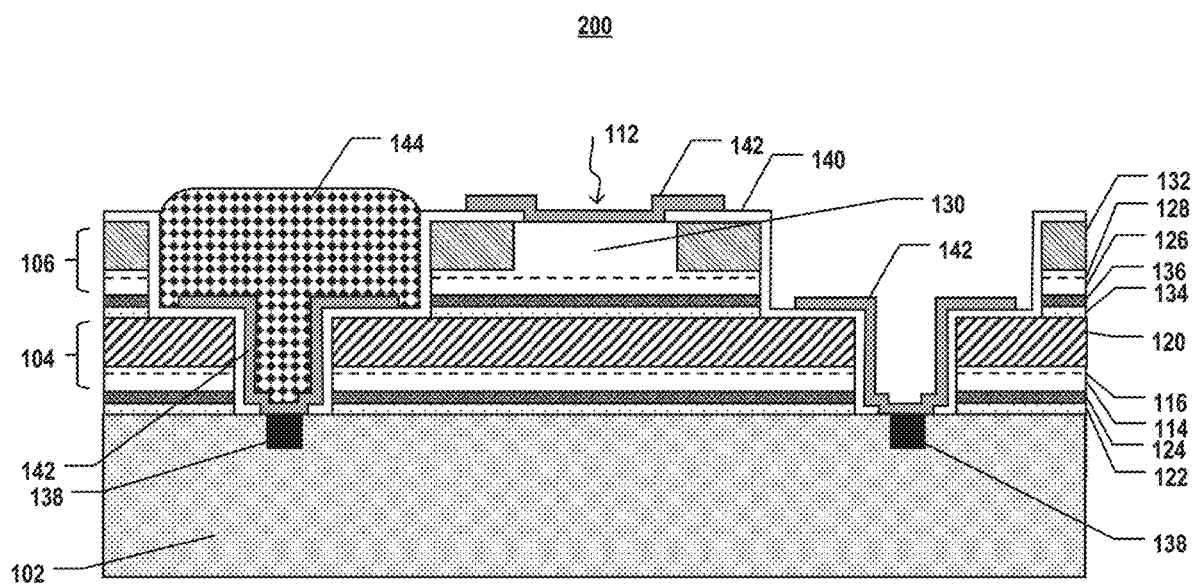

FIG. 3 illustrates a top view of another exemplary LED structure 200, according to some implementations of the present disclosure. FIG. 4A illustrates a cross section of LED structure 200 along line A-A', and FIG. 4B illustrates a cross section of LED structure 200 along line B-B', according to some implementations of the present disclosure. For the purpose of better explaining the present disclosure, the top view of LED structure 200 in FIG. 3 and the cross sections of LED structure 200 in FIGS. 4A-4B will be described together.

LED structure 200 is similar to LED structure 100 and also includes first substrate 102, first semiconductor layer 104 formed on first substrate 102, and second semiconductor layer 106 formed on first semiconductor layer 104. First semiconductor layer 104 includes first LED unit 108 and second LED unit 110, and second semiconductor layer 106 includes third LED unit 112. First LED unit 108 and second LED unit 110 are horizontally adjacent to each other. Third LED unit 112 is formed in second semiconductor layer 106 above first LED unit 108 and second LED unit 110.

As described above, the top surface of first semiconductor layer 104 may be substantially flat, and second semiconductor layer 106 could be formed or bonded on first semiconductor layer 104. Furthermore, by using different materials to form first semiconductor layer 104 and second semiconductor layer 106, first LED unit 108 and second LED unit 110 may emit light of the first color, and third LED unit 112 may emit light of the second color. As shown in FIGS. 3 and 4A-4B, a color conversion layer 144 is formed on first LED unit 108. Color conversion layer 144 may convert light of the first color to a third color. In some implementations, color conversion layer 144 may include phosphor. For example, color conversion layer 144 may include Cerium (III)-doped YAG (YAG:Ce$^{3+}$, or Y$_3$Al$_5$O$_{12}$: Ce$^{3+}$) to absorb blue light and emit red light. In some implementations, color conversion layer 144 may include quantum dots. For example, the quantum dots formed on first LED unit 108 may convert blue light and to red light. In some implementations, by using different color quantum dots, light of first LED unit 108 may be converted to other colors.

In some implementations, color conversion layer 144 may be formed on first LED unit 108 by printing technology. In some implementations, color conversion layer 144 may be formed on first LED unit 108 by the photolithography process. It is understood that the descriptions of the material and the manufacture method of color conversion layer 144 are merely illustrative and are not limiting, and those skilled in the art can make changes according to requirements, all of which are within the scope of the present application.

By forming color conversion layer 144 on first LED unit 108 to convert the first color emitted by first LED unit 108 to the third color, LED structure 200 may emit at least three different colors. When individually applying different bias voltages to first LED unit 108, second LED unit 110, and third LED unit 112 (three sub-pixels), the three primary colors, e.g., red, green and blue, may integrally form a full color pixel.

FIGS. 5-15B illustrate cross sections of an exemplary LED structure 300 at different stages of a manufacturing process, according to some implementations of the present disclosure. FIGS. 16-21 illustrate top views of LED structure 300 at different stages of a manufacturing process, according to some implementations of the present disclosure. FIG. 22 is a flowchart of an exemplary method 400 for manufacturing LED structure 300, according to some implementations of the present disclosure. For the purpose of better describing the present disclosure, the cross sections of LED structure 300 in FIGS. 5-15B, the top views of LED structure 300 in FIGS. 16-21, and the flowchart of method 400 in FIG. 22, will be described together.

Figure 5:
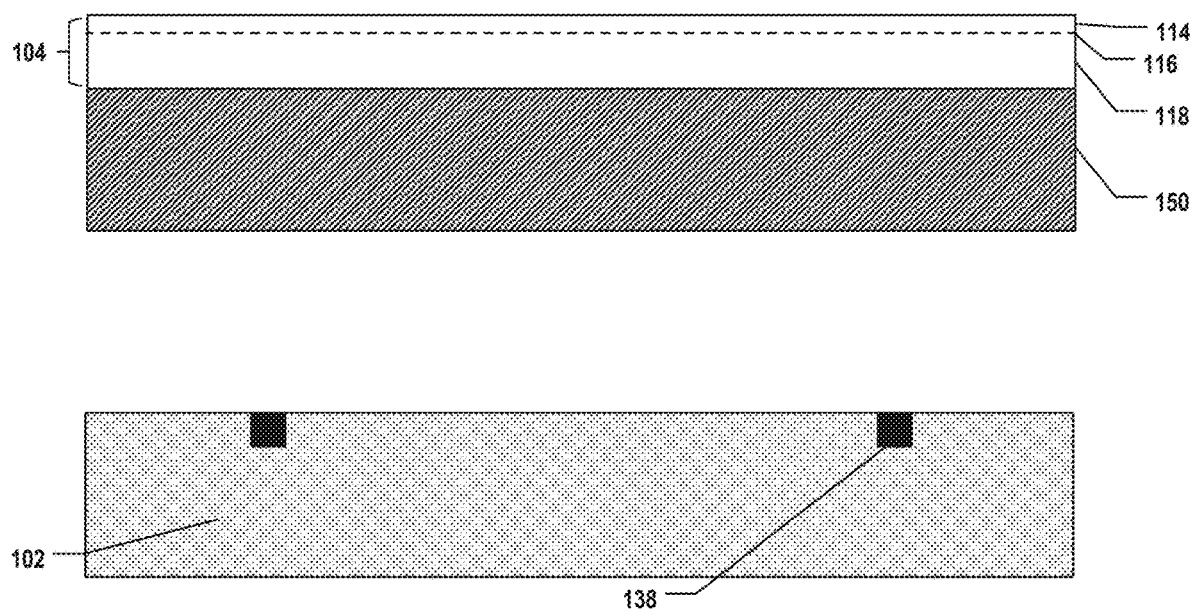
FIGS. 5-15C illustrate cross sections of an exemplary LED structure at different stages of a manufacturing process of the LED structure, according to some implementations of the present disclosure.

As shown in FIG. 5, a driving circuit is formed in first substrate 102 and the driving circuit includes a plurality of contacts 138. For example, the driving circuit may include CMOS devices manufactured on a silicon wafer and some wafer-level packaging layers or fan-out structures are stacked on the CMOS devices to form contacts 138. For another example, the driving circuit may include TFTs manufactured on a glass substrate and some wafer-level packaging layers or fan-out structures are stacked on the TFTs to form contacts 138. First semiconductor layer 104 is formed on a second substrate 150, and first semiconductor layer 104 includes first doping semiconductor layer 114, second doping semiconductor layer 118 and first MQW layer 116.

In some implementations, first substrate 102 or second substrate 150 may include a semiconductor material, such as silicon, silicon carbide, gallium nitride, germanium, gallium arsenide, indium phosphide. In some implementations, first substrate 102 or second substrate 150 may be made from an electrically non-conductive material, such as a glass, a plastic or a sapphire wafer. In some implementations, first substrate 102 may have driving circuits formed therein, and first substrate 102 may include a CMOS backplane or TFT glass substrate. In some implementations, first doping semiconductor layer 114 and second doping semiconductor layer 118 may include one or more layers based on II-VI materials, such as ZnSe or ZnO, or III-V nitride materials, such as GaN, AlN, InN, InGaN, GaP, AlInGaP, AlGaAs, and their alloys. In some implementations, first doping semiconductor layer 114 may include a p-type semiconductor layer, and second doping semiconductor layer 118 may include a n-type semiconductor layer.

Figure 6:
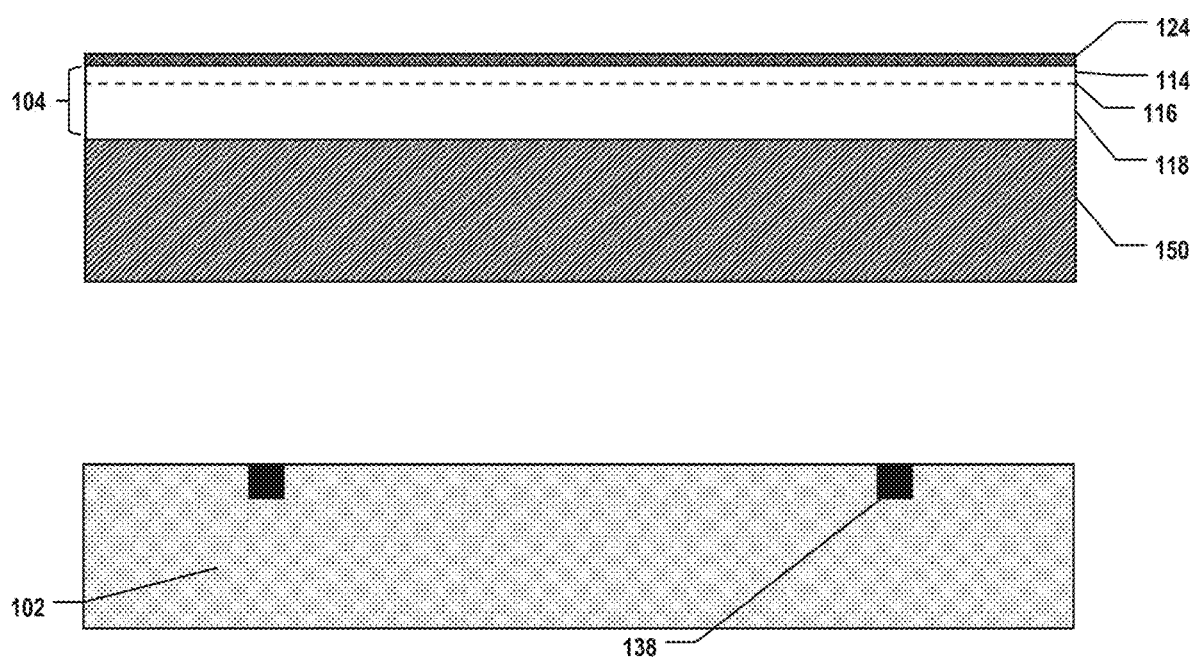

In FIG. 6, first reflective layer 124 is optionally formed on first semiconductor layer 104. In some implementations, first reflective layer 124 may include a reflective p-type Ohmic contact layer. First reflective layer 124 may also function as a metal mirror to reflect the light emitted by the LED units. In some implementations, first reflective layer 124 may be a metal or metal alloy layer having a high reflectivity, e.g., silver, aluminum, gold, and their alloys.

Figure 7:
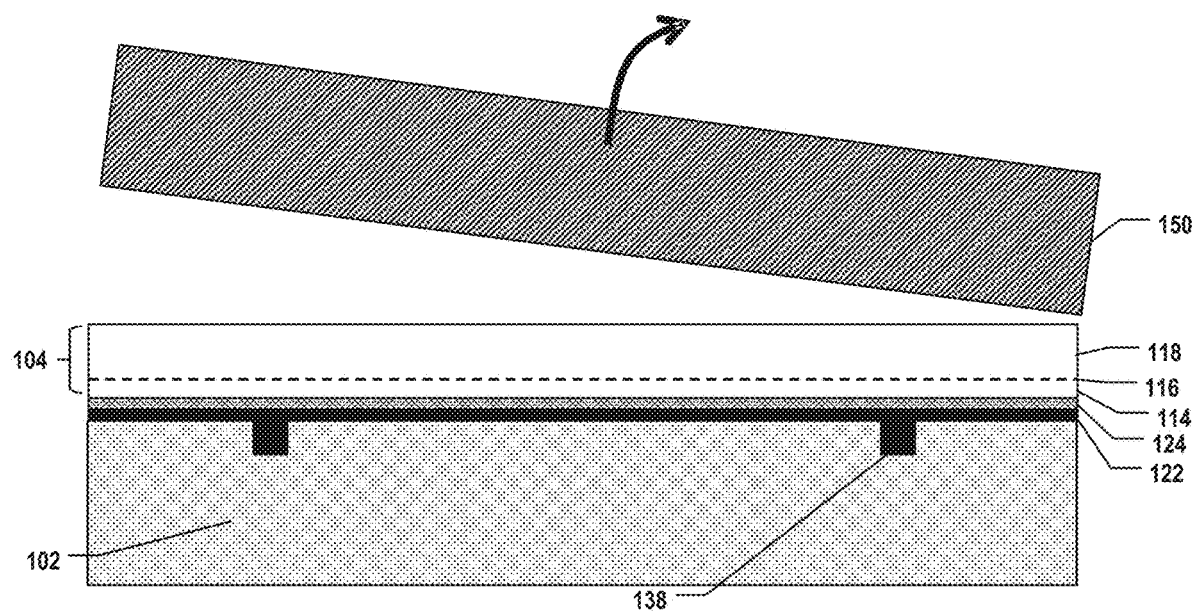

Then, in operation 402 of FIG. 22 and as shown in FIG. 7, second substrate 150, first reflective layer 124, and first semiconductor layer 104, including first doping semiconductor layer 114, second doping semiconductor layer 118 and first MQW layer 116, are flipped over and bonded to first substrate 102 through first bonding layer 122. Then, second substrate 150 is removed from first semiconductor layer 104.

In some implementations, first bonding layer 122 may include a conductive material, such as metal or metal alloy. In some implementations, first bonding layer 122 may include Au, Sn, In, Cu or Ti. In some implementations, first bonding layer 122 may include a non-conductive material, such as polyimide (PI), or polydimethylsiloxane (PDMS). In some implementations, first bonding layer 122 may include a photoresist, such as SU-8 photoresist. In some implementations, first bonding layer 122 may include hydrogen silsesquioxane (HSQ) or divinylsiloxane-bis-benzocyclobutene (DVS-BCB). FIG. 7 shows a single layer structure of first bonding layer 122, however, in some implementations, first bonding layer 122 may include one or multiple layers to bond first substrate 102 and first reflective layer 124. For example, first bonding layer 122 may include a single conductive or non-conductive layer. For another example, first bonding layer 122 may include an adhesive layer and a conductive or non-conductive layer. It is understood that the descriptions of the material of first bonding layer 122 are merely illustrative and are not limiting, and those skilled in the art can make changes according to requirements, all of which are within the scope of the present application.

Figure 8A:
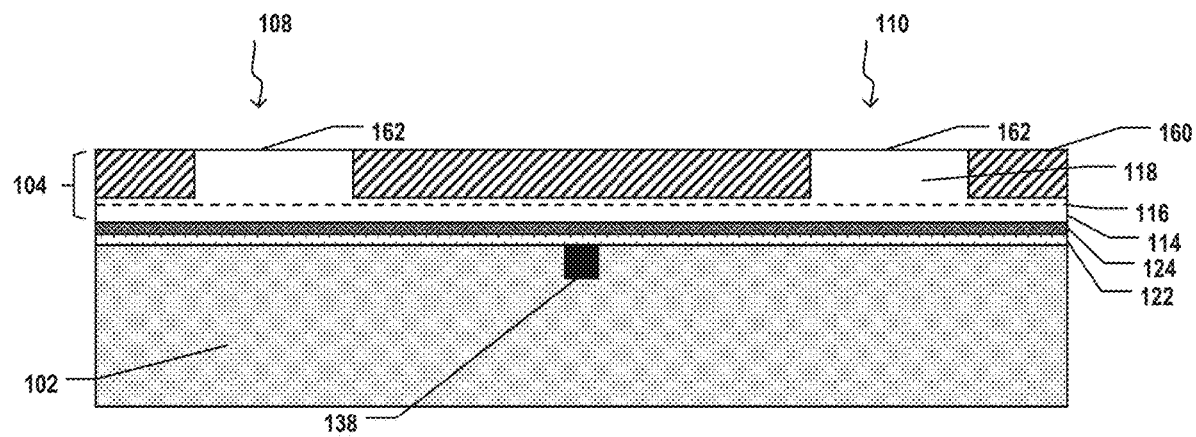
Figure 8B:
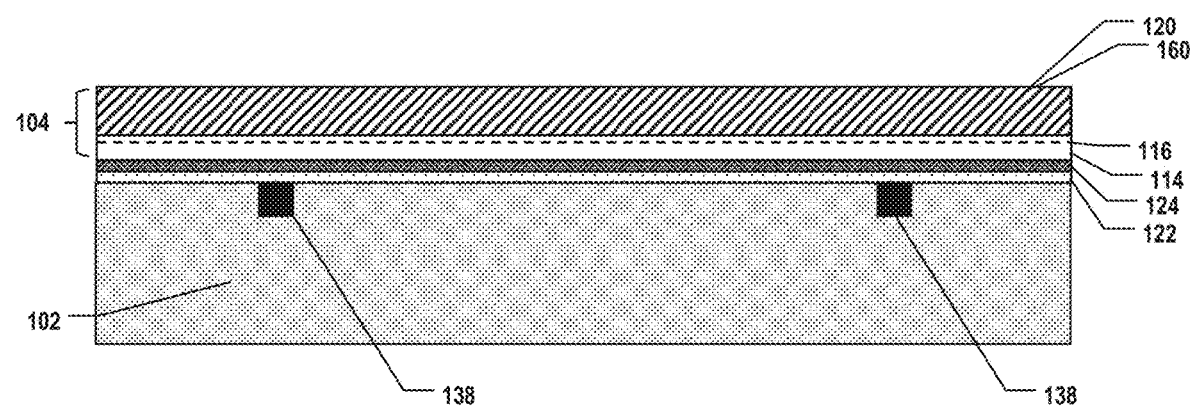
Figure 16:
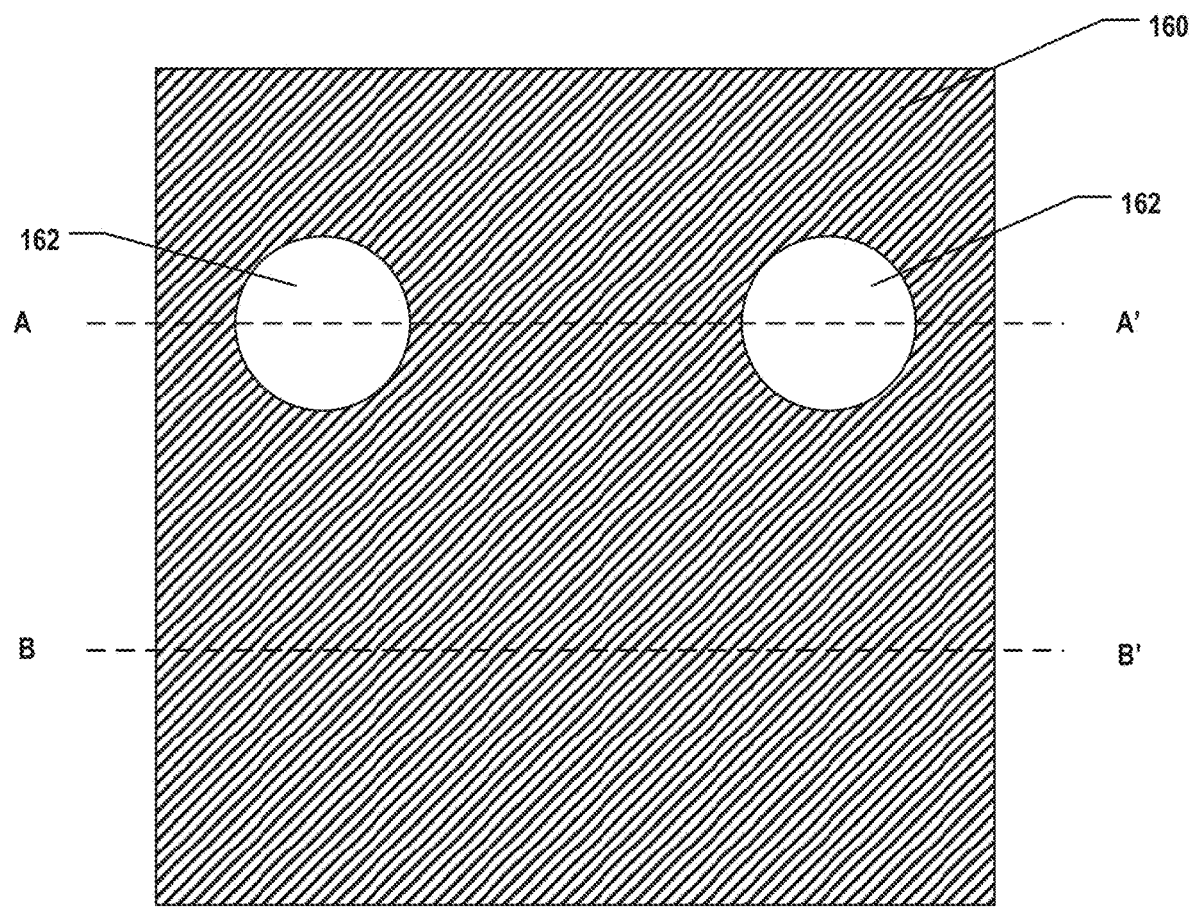
FIGS. 16-21 illustrate top views of an exemplary LED structure at different stages of a manufacturing process of the LED structure, according to some implementations of the present disclosure.

In operation 404 of FIG. 22, a first implantation operation is performed to form a first implanted region 160 and a first non-implanted region 162 in second doping semiconductor layer 118. FIG. 16 illustrates a top view of LED structure 300 after performing the first implantation operation. FIG. 8A illustrates a cross section of LED structure 300 along line A-A' in FIG. 16, and FIG. 8B illustrates a cross section of LED structure 300 along line B-B' in FIG. 16.

Optionally, before performing the first implantation operation, a thinning operation may be performed on second doping semiconductor layer 118 to remove a portion of second doping semiconductor layer 118 to a predefined thickness. In some implementations, the thinning operation may include a dry etching or a wet etching operation. In some implementations, the thinning operation may include a chemical-mechanical polishing (CMP) operation.

After the first implantation operation, first implanted region 160 and first non-implanted region 162 are defined in second doping semiconductor layer 118. The material in first non-implanted region 162 may be the same as second doping semiconductor layer 118. The material in first implanted region 160 may be transformed from second doping semiconductor layer 118 to first ion-implanted material 120 by the first implantation operation. First implanted region 160 (first ion-implanted material 120) may isolate LED units 108 and 110 later formed in first semiconductor layer 104, and first non-implanted region 162 (second doping semiconductor layer 118) may define the light emitting region of LED units 108 and 110 later formed in first semiconductor layer 104.

In some implementations, first ion-implanted material 120 may be formed by implanting $H^+$, $He^+$, $N^+$, $O^+$, $F^+$, $Mg^+$, $Si^+$ or $Ar^+$ ions in second doping semiconductor layers 118. In some implementations, second doping semiconductor layers 118 may be implanted with one or more ion materials to form first ion-implanted material 120. First ion-implanted material 120 has the physical properties of electrical insulation. By implanting ion material in a defined area of second doping semiconductor layers 118, the material of second doping semiconductor layer 118 in the defined area may be transformed to first ion-implanted material 120 and electrically isolate LED mesas of first LED unit 108 and second LED unit 110.

In some implementations, first ion-implanted material 120 may be formed in second doping semiconductor layer 118 for a depth not sufficient to penetrate first MQW layer 116. In some implementations, the implantation depth of first ion-implanted material 120 may be controlled so that first ion-implanted material 120 stops short to contact first MQW layer 116, as shown in FIGS. 8A and 8B. First MQW layer 116, first doping semiconductor layer 114, first reflective layer 124 and bonding layer 122 beneath each LED mesa may horizontally extend to first MQW layer 116, first doping semiconductor layer 114, first reflective layer 124 and bonding layer 122 beneath adjacent LED mesas.

By using first ion-implanted material 120 to isolate first LED unit 108 and second LED unit 110 and define the light emitting area of first LED unit 108 and second LED unit 110, the top surface of the light emitting area (second doping semiconductor layer 118) and the non-light emitting area (first ion-implanted material 120) can be formed coplanar, and the top surface of first semiconductor layer 104 may be kept substantially flat as well. Hence another semiconductor layer (second semiconductor layer 106) could be later formed or bonded on first semiconductor layer 104.

Figure 9A:
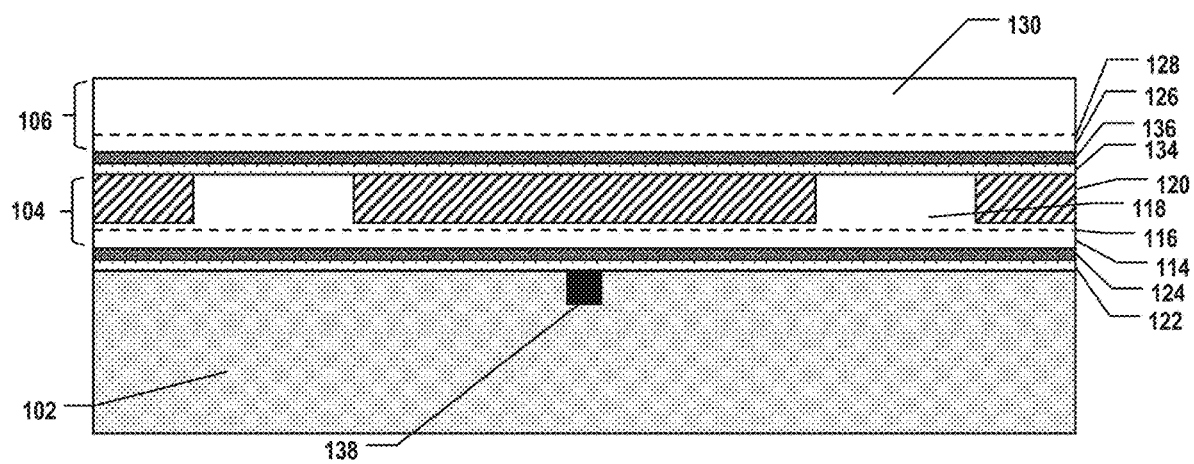
Figure 9B:
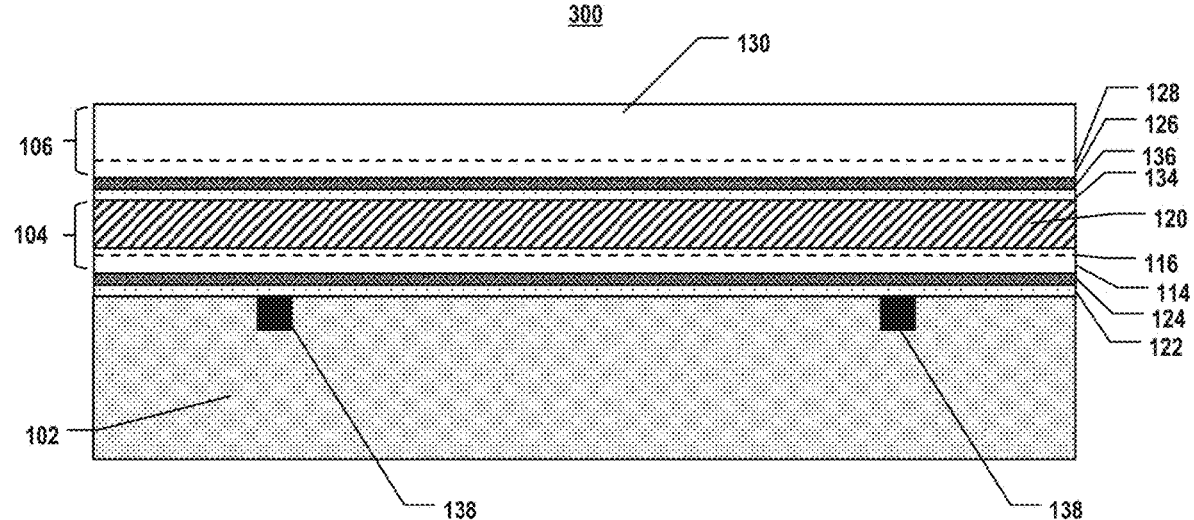

Referring to operation 406 of FIG. 22 and FIGS. 9A and 9B, second semiconductor layer 106 is formed on first semiconductor layer 104. Second semiconductor layer 106 includes third doping semiconductor layer 126, second MQW layer 128 on third doping semiconductor layer 126, and fourth doping semiconductor layer 130 on second MQW layer 128. Similar to the manufacturing process of first semiconductor layer 104, second semiconductor layer 106 may be first formed on a third substrate (not shown), and second reflective layer 136 may be optionally formed on second semiconductor layer 106. Then, the third substrate, second semiconductor layer 106, and second reflective layer 136 are flipped over and bonded to first semiconductor layer 104 through second bonding layer 134. Then, the third substrate is removed from second semiconductor layer 106.

Figure 10A:
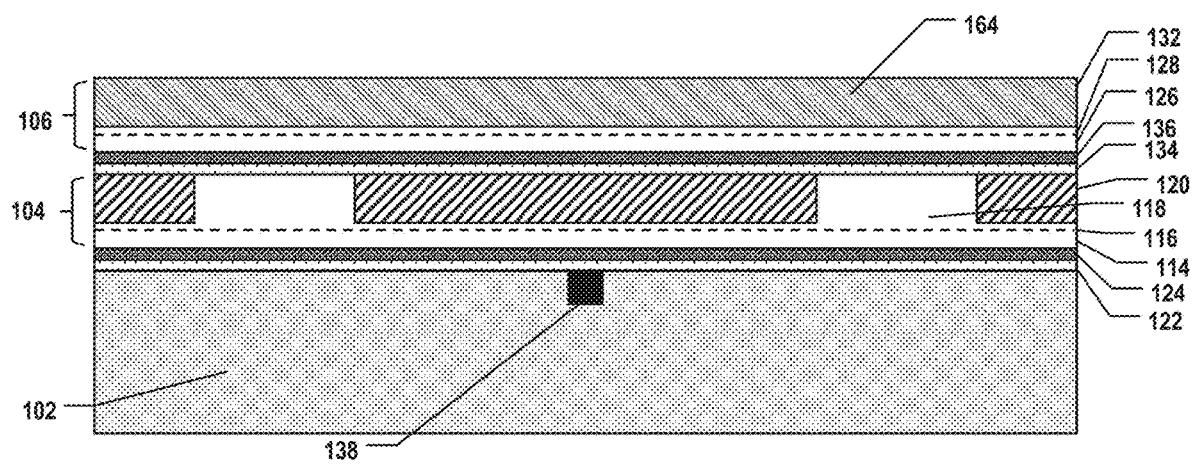
Figure 10B:
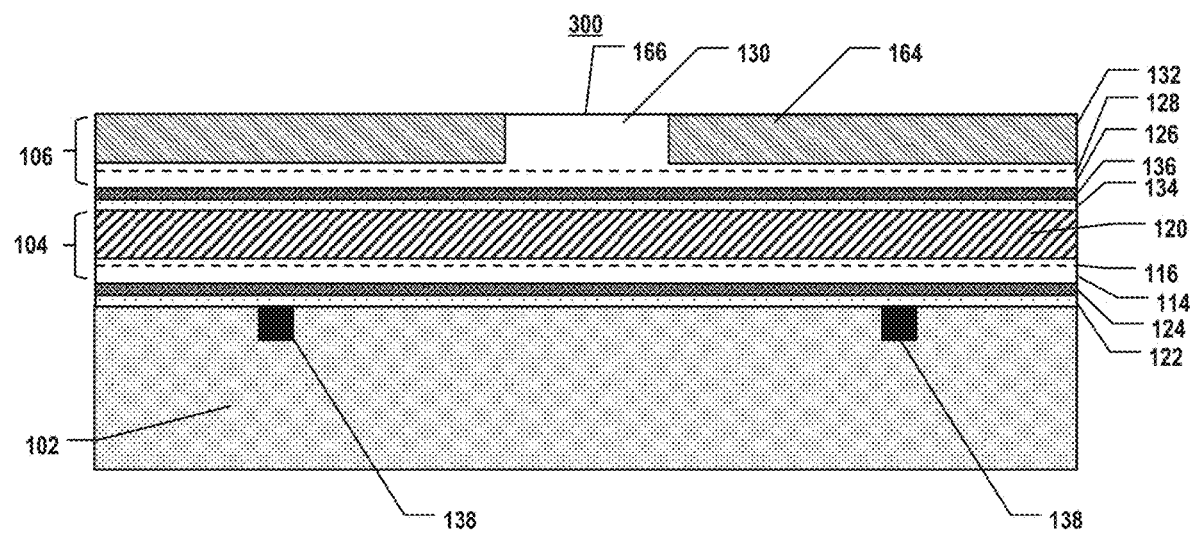
Figure 17:
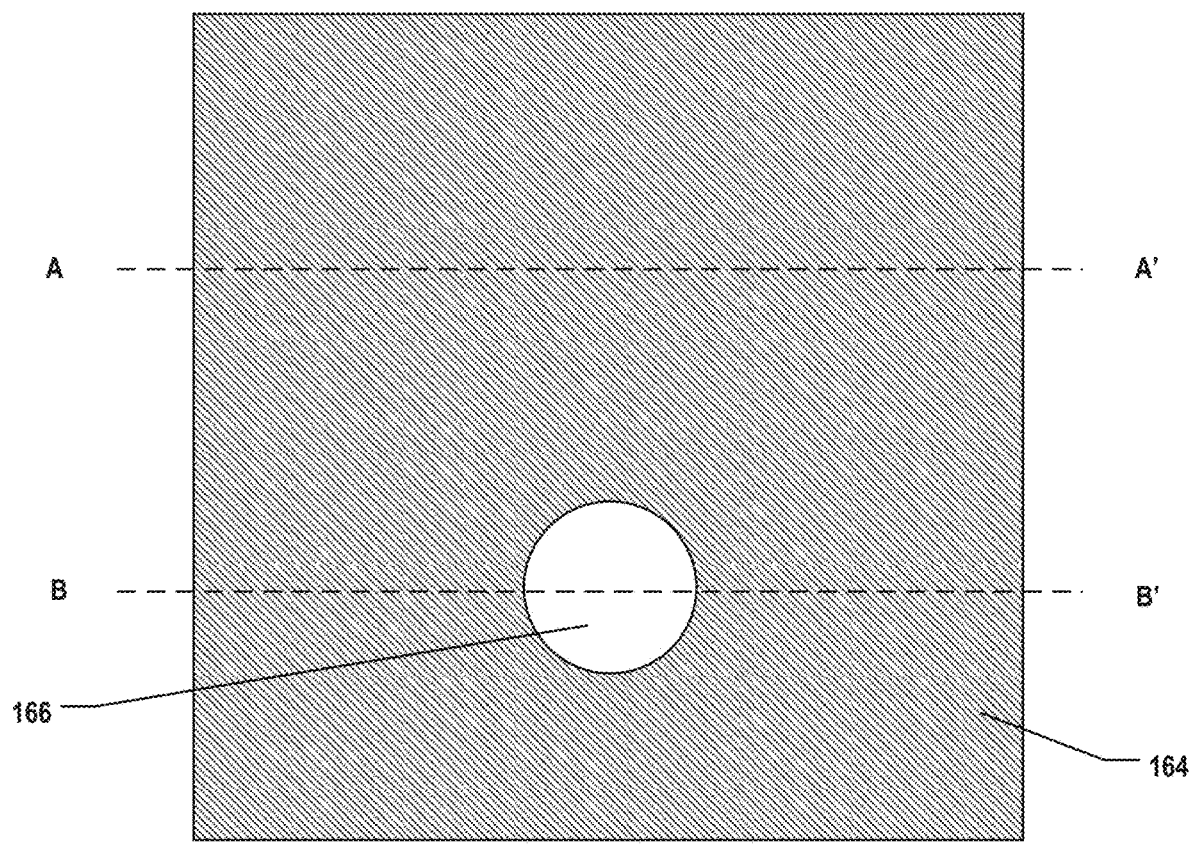

Referring to operation 408 of FIG. 22, a second implantation operation is performed to form a second implanted region 164 and a second non-implanted region 166 in fourth doping semiconductor layer 130. FIG. 17 illustrates a top view of LED structure 300 after performing the second implantation operation. FIG. 10A illustrates a cross section of LED structure 300 along line A-A' in FIG. 17, and FIG. 10B illustrates a cross section of LED structure 300 along line B-B' in FIG. 17.

Optionally, before performing the second implantation operation, a thinning operation may be performed on fourth doping semiconductor layer 130 to remove a portion of fourth doping semiconductor layer 130 to a predefined thickness. In some implementations, the thinning operation may include a dry etching or a wet etching operation. In some implementations, the thinning operation may include a chemical-mechanical polishing (CMP) operation.

After the second implantation operation, second implanted region 164 and second non-implanted region 166 are defined in fourth doping semiconductor layer 130. The material in second non-implanted region 166 may be the same as fourth doping semiconductor layer 130. The material in second implanted region 164 may be transformed from fourth doping semiconductor layer 130 to second ion-implanted material 132 by the second implantation operation. Second implanted region 164 (second ion-implanted material 132) may isolate third LED unit 112 later formed in second semiconductor layer 106 with other LED units, and second non-implanted region 166 (fourth doping semiconductor layer 130) may define the light emitting region of third LED unit 112 later formed in second semiconductor layer 106.

In some implementations, second ion-implanted material 132 may be formed by implanting $H^+$, $He^+$, $N^+$, $O^+$, $F^+$, $Mg^+$, $Si^+$ or $Ar^+$ ions in fourth doping semiconductor layers 130. In some implementations, fourth doping semiconductor layers 130 may be implanted with one or more ion materials to form second ion-implanted material 132. Second ion-implanted material 132 has the physical properties of electrical insulation. By implanting ion material in a defined area of fourth doping semiconductor layers 130, the material of fourth doping semiconductor layer 130 in the defined area may be transformed to second ion-implanted material 132 and electrically isolate LED mesa of third LED unit 112 with other LED units.

In some implementations, second ion-implanted material 132 may be formed in fourth doping semiconductor layer 130 for a depth not sufficient to penetrate second MQW layer 128. In some implementations, the implantation depth of second ion-implanted material 132 may be controlled so that second ion-implanted material 132 stops short to contact second MQW layer 128, as shown in FIGS. 10A and 10B.

Figure 11A:
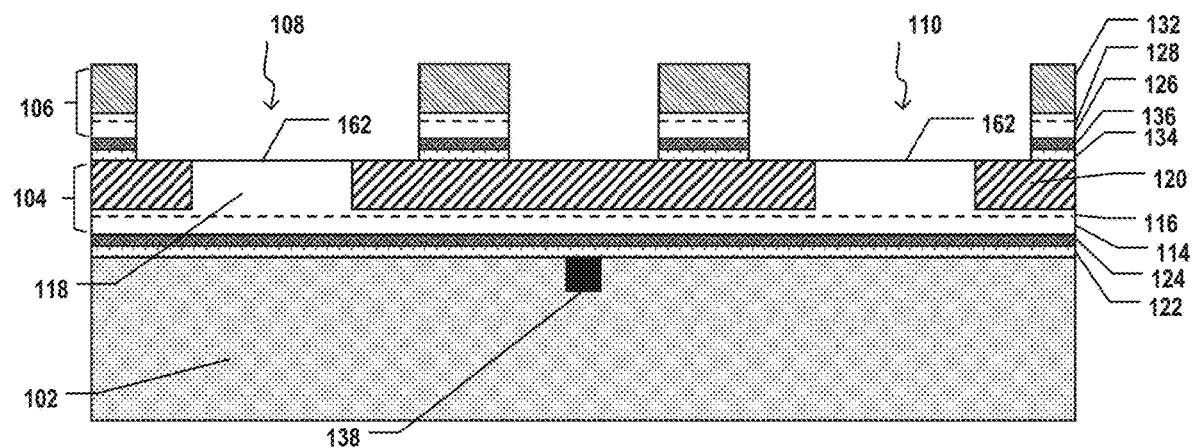
Figure 11B:
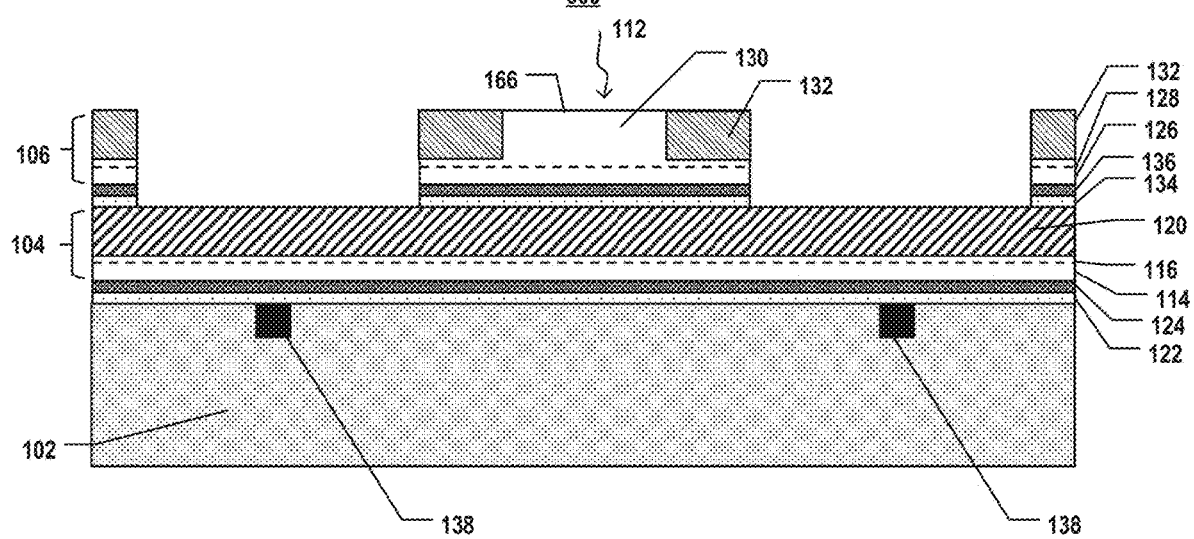
Figure 18:
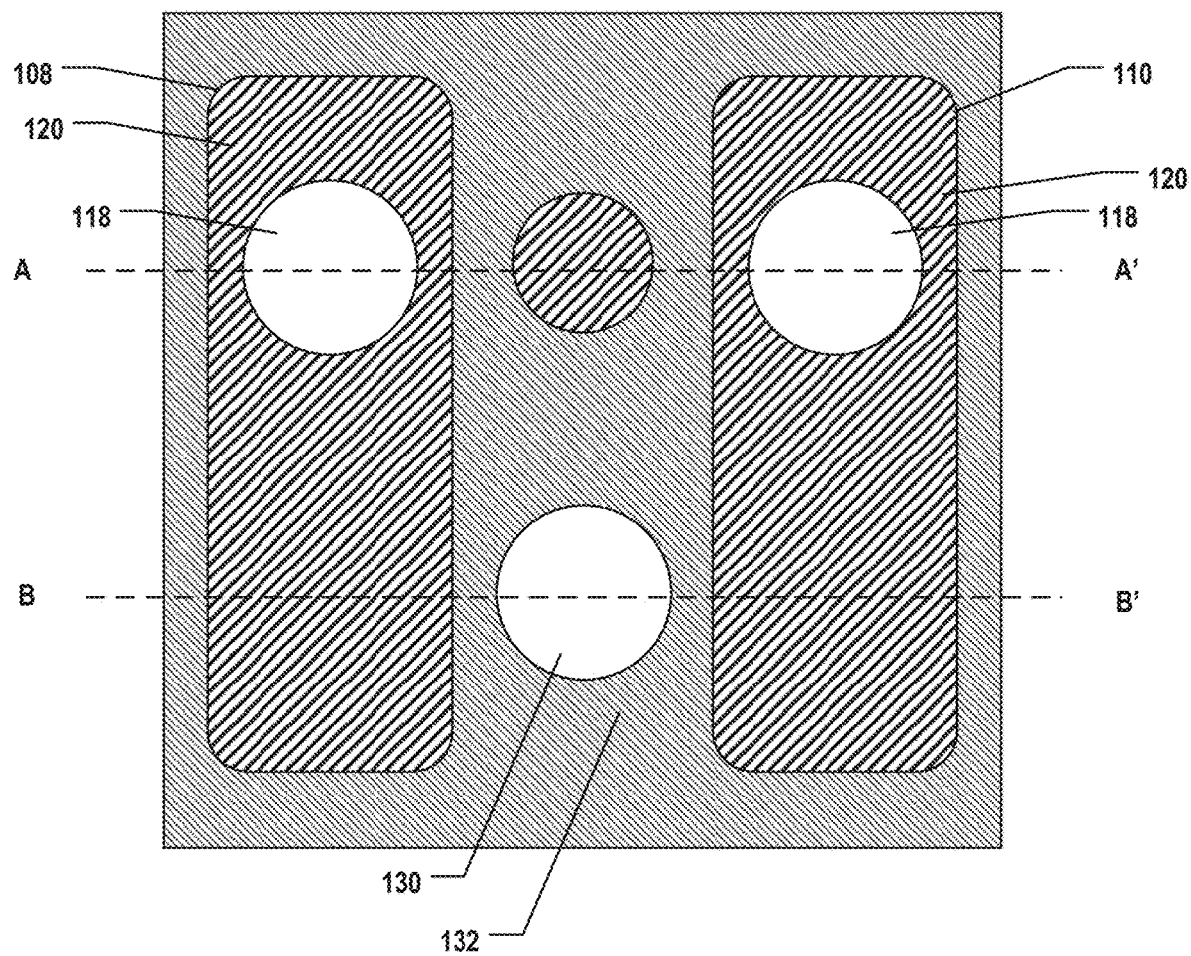

In operation 410 of FIG. 22, a first etch operation is performed to remove a portion of second semiconductor layer 106, a portion of second reflective layer 136, and a portion of second bonding layer, and expose at least first non-implanted region 162 in the second doping semiconductor layer 118. FIG. 18 illustrates a top view of LED structure 300 after performing the first etch operation. FIG. 11A illustrates a cross section of LED structure 300 along line A-A' in FIG. 18, and FIG. 11B illustrates a cross section of LED structure 300 along line B-B' in FIG. 18. In some implementations, the first etch operation may be dry etch, wet etch, or other suitable processes.

As shown in FIG. 18, two rectangle regions are removed from second semiconductor layer 106, and these two rectangle regions may be the regions of first LED unit 108 and second LED unit 110. The exposed regions include second doping semiconductor layer 118 and a portion of first ion-implanted material 120. The first etch operation is performed to remove a portion of second semiconductor layer 106 above the light emitting areas of first semiconductor layer 104, and also expose a portion of first semiconductor layer 104 above the plurality of contacts 138 that will be exposed in a later operation. It is understood that the location and shape of exposed second doping semiconductor layer 118 and first ion-implanted material 120 shown in FIGS. 18 and 11A-11B are merely illustrative and are not limiting, and those skilled in the art can make changes according to requirements, all of which are within the scope of the present application.

Figure 12A:
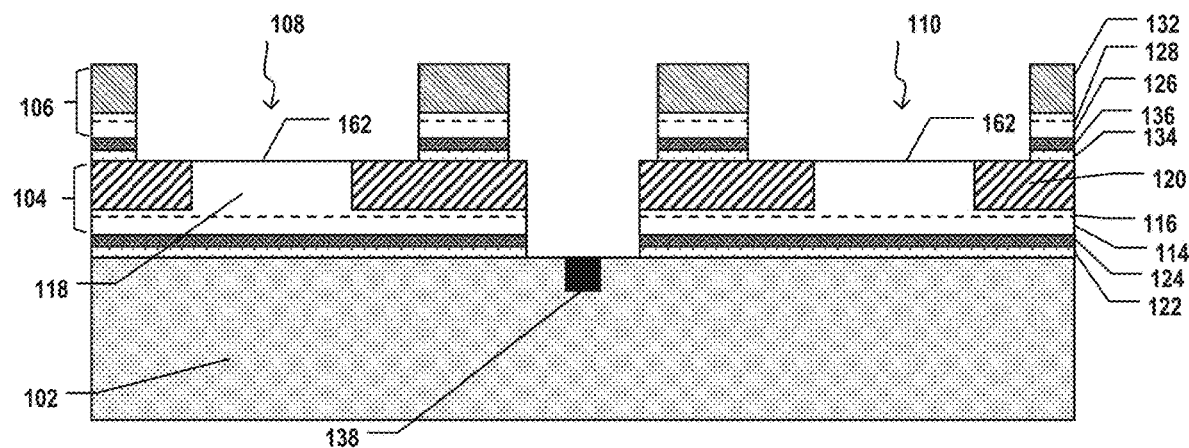
Figure 12B:
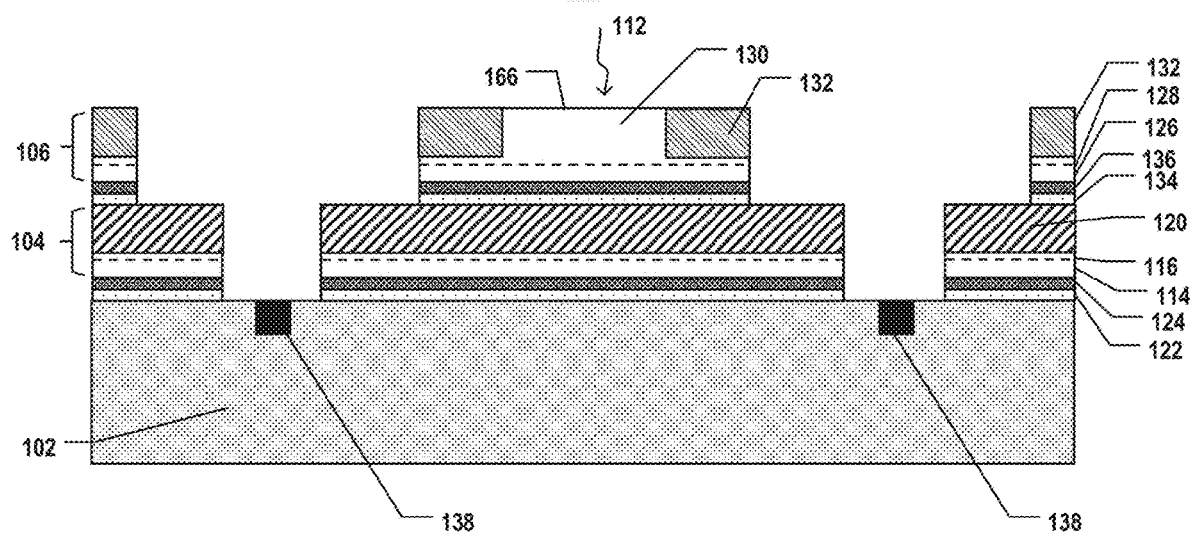
Figure 13A:
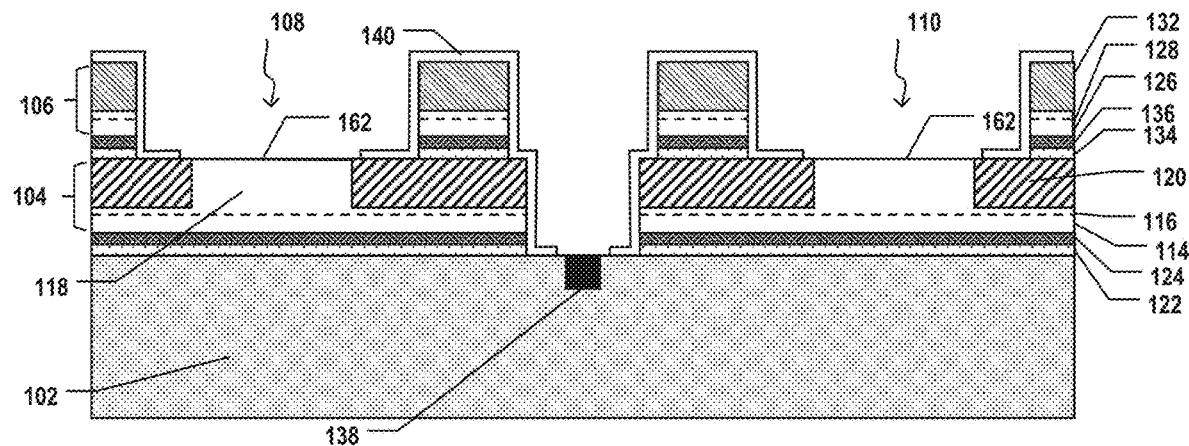
Figure 13B:
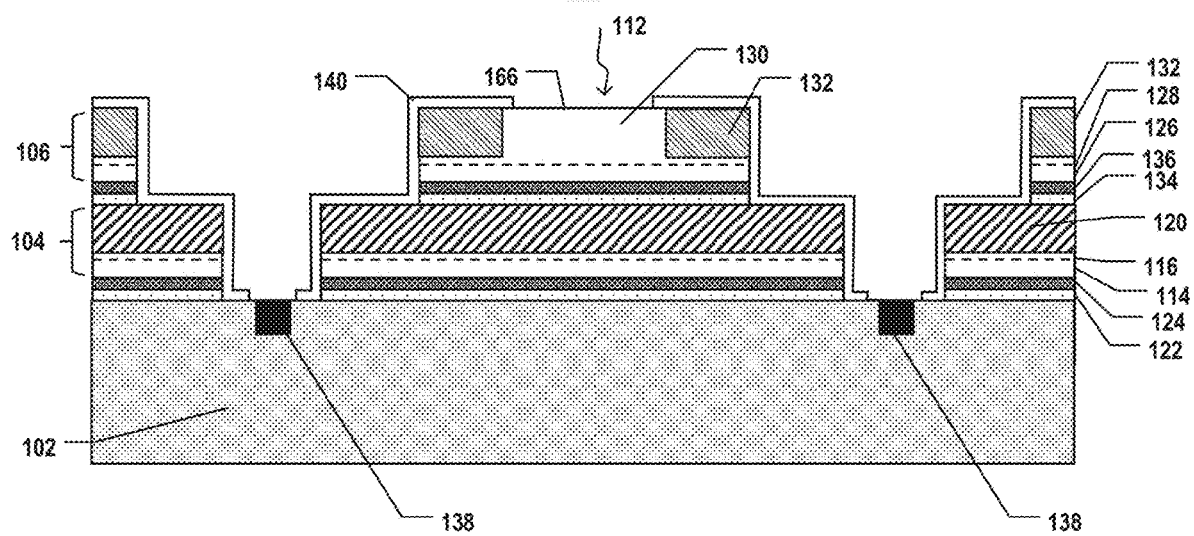
Figure 19:
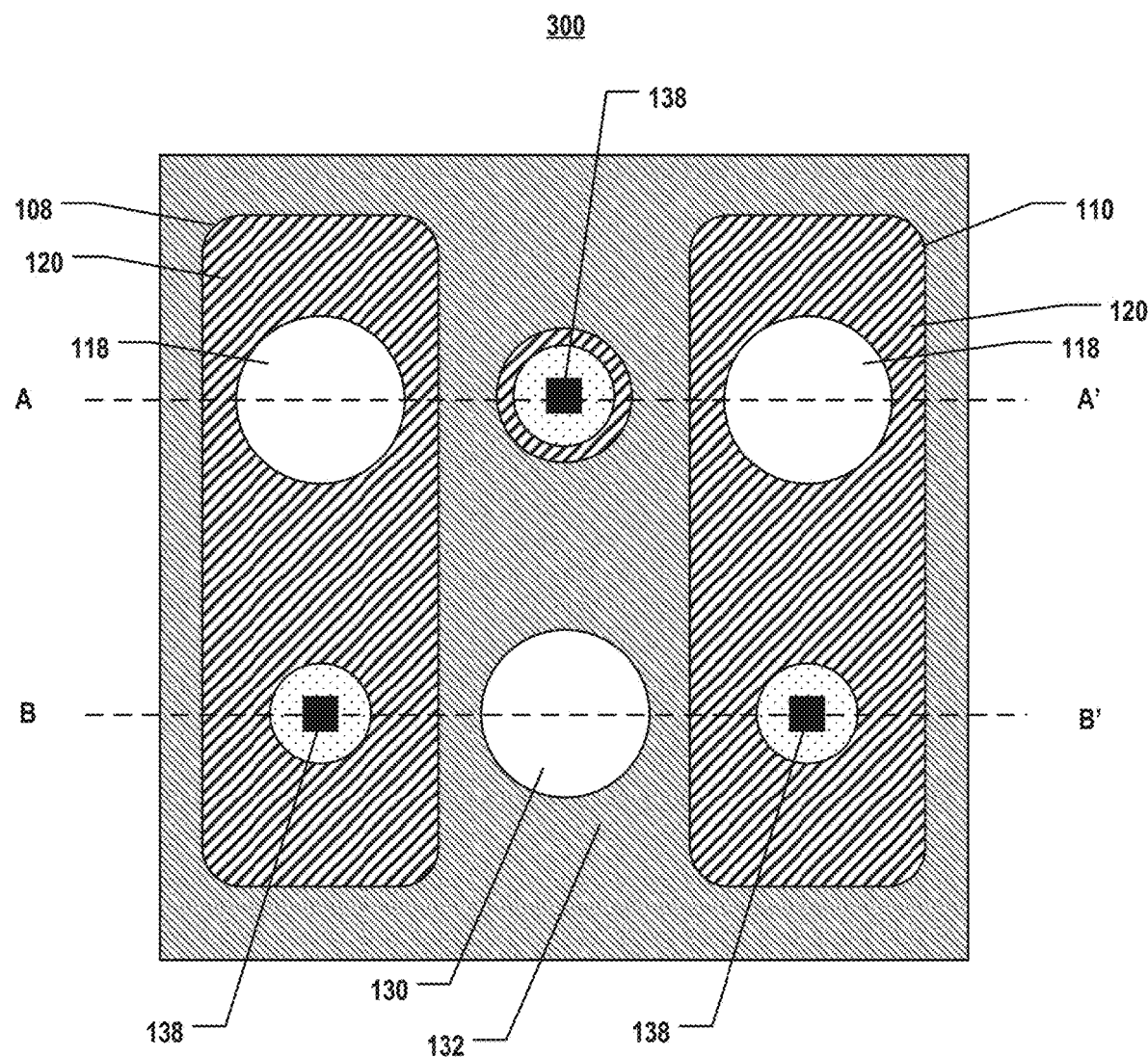

In operation 412 of FIG. 22, a second etch operation is performed to expose a plurality of contacts 138 of the driving circuit formed in first substrate 102. FIG. 19 illustrates a top view of LED structure 300 after performing the second etch operation. FIG. 12A illustrates a cross section of LED structure 300 along line A-A' in FIG. 19, and FIG. 12B illustrates a cross section of LED structure 300 along line B-B' in FIG. 19. Then, as shown in FIGS. 13A and 13B, passivation layer 140 is formed over first semiconductor layer 104 and second semiconductor layer 106, and first non-implanted region 162 in second doping semiconductor layer 118, second non-implanted region 166 in fourth doping semiconductor layer 130, and the plurality of contacts 138 are exposed. In some implementations, passivation layer 140 may include $SiO_2$, $Al_2O_3$, SiN or other suitable materials for isolation and protection. In some implementations, passivation layer 140 may include polyimide, SU-8 photoresist, or other photo-patternable polymer.

Figure 14A:
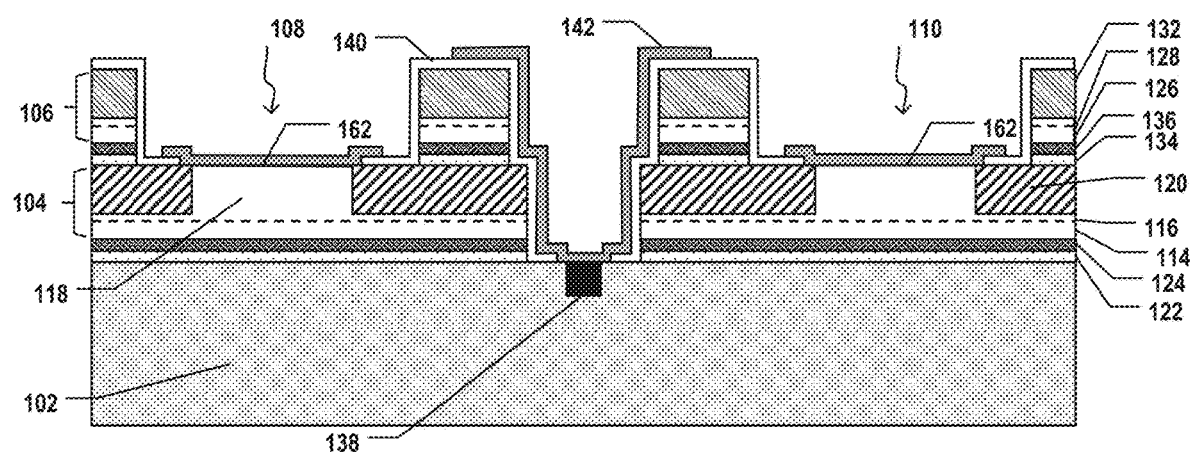
Figure 14B:
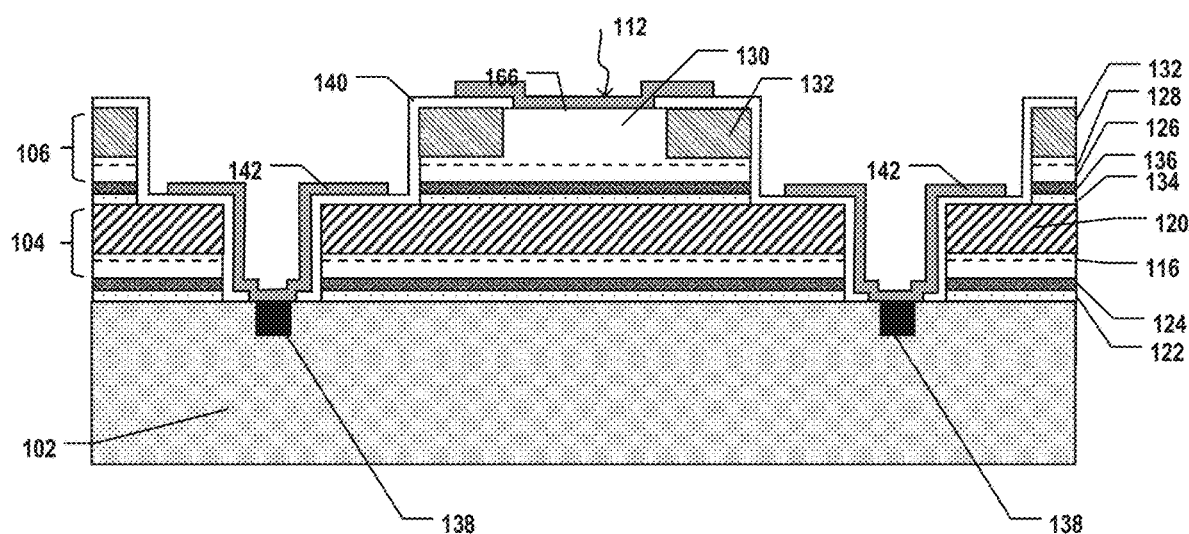
Figure 20:
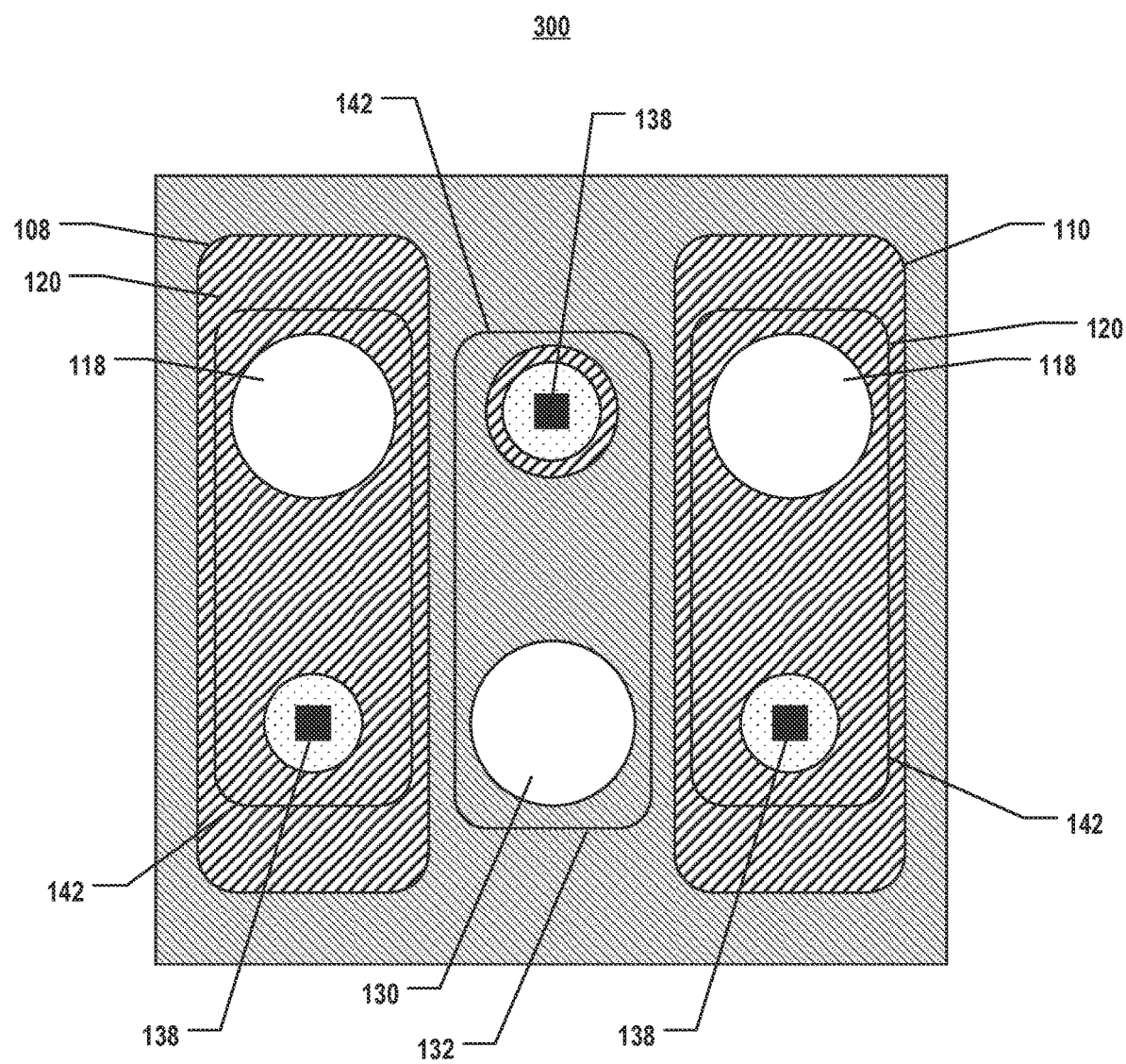

In operation 414 of FIG. 22, first non-implanted region 162 in second doping semiconductor layer 118 is electrically connected to contact 138 through electrode layer 142, and second non-implanted region 166 in fourth doping semiconductor layer 130 is electrically connected to contact 138 through electrode layer 142 as well. FIG. 20 illustrates a top view of LED structure 300 after forming electrode layer 142. FIG. 14A illustrates a cross section of LED structure 300 along line A-A' in FIG. 20, and FIG. 14B illustrates a cross section of LED structure 300 along line B-B' in FIG. 20. Electrode layer 142 electrically connects second doping semiconductor layer 118 or fourth doping semiconductor layer 130 and contacts 138 and forms an electrical path to connect the LED units with the driving circuit in first substrate 102. The driving circuit may control the voltage and current level of first LED unit 108, second LED unit 110 and third LED unit 112 through contacts 138 and electrode layer 142. In some implementations, electrode layer 142 may include conductive materials, such as indium tin oxide (ITO), Cr, Ti, Pt, Au, Al, Cu, Ge or Ni.

Figure 15A:
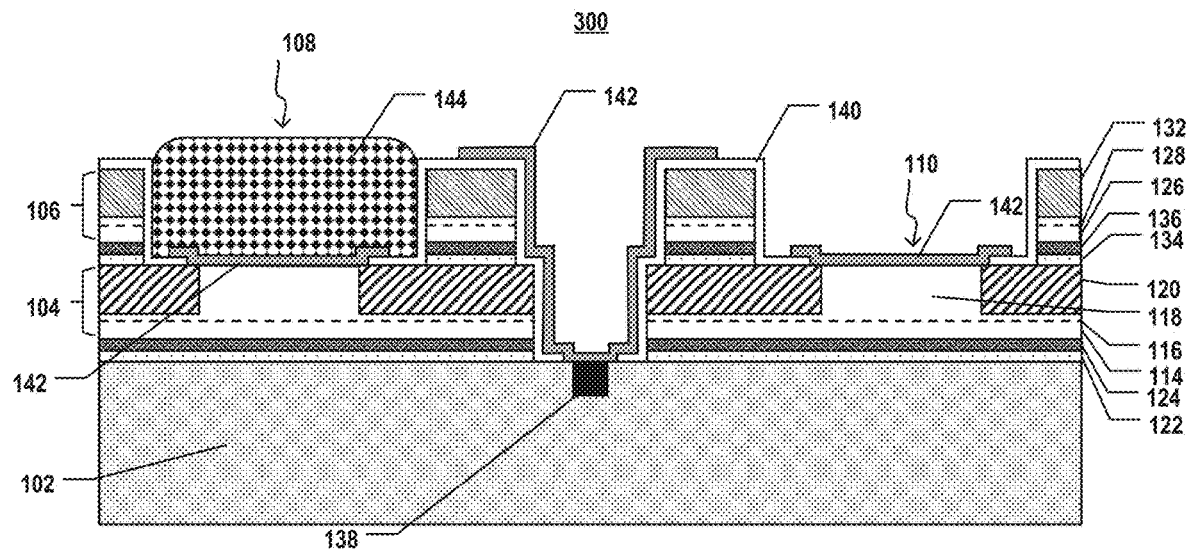
Figure 15B:
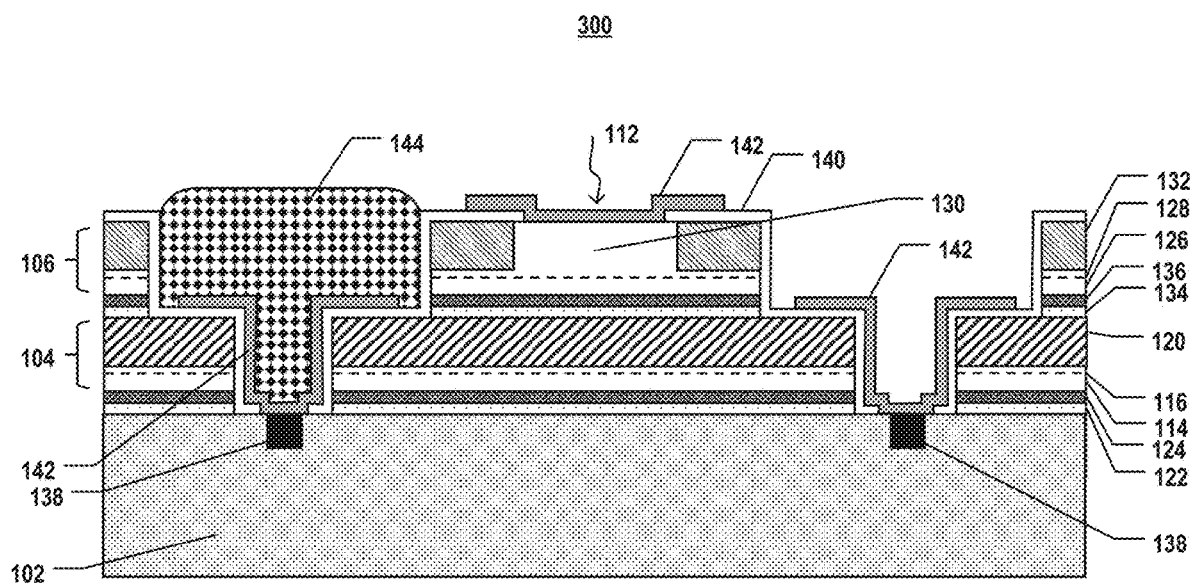
Figure 15C:
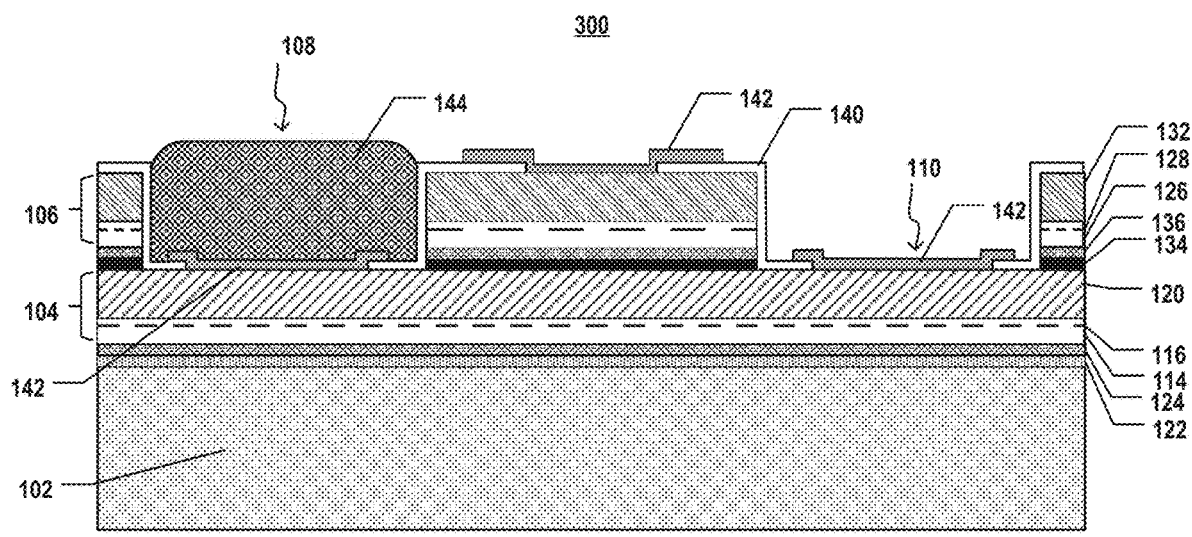
Figure 21:
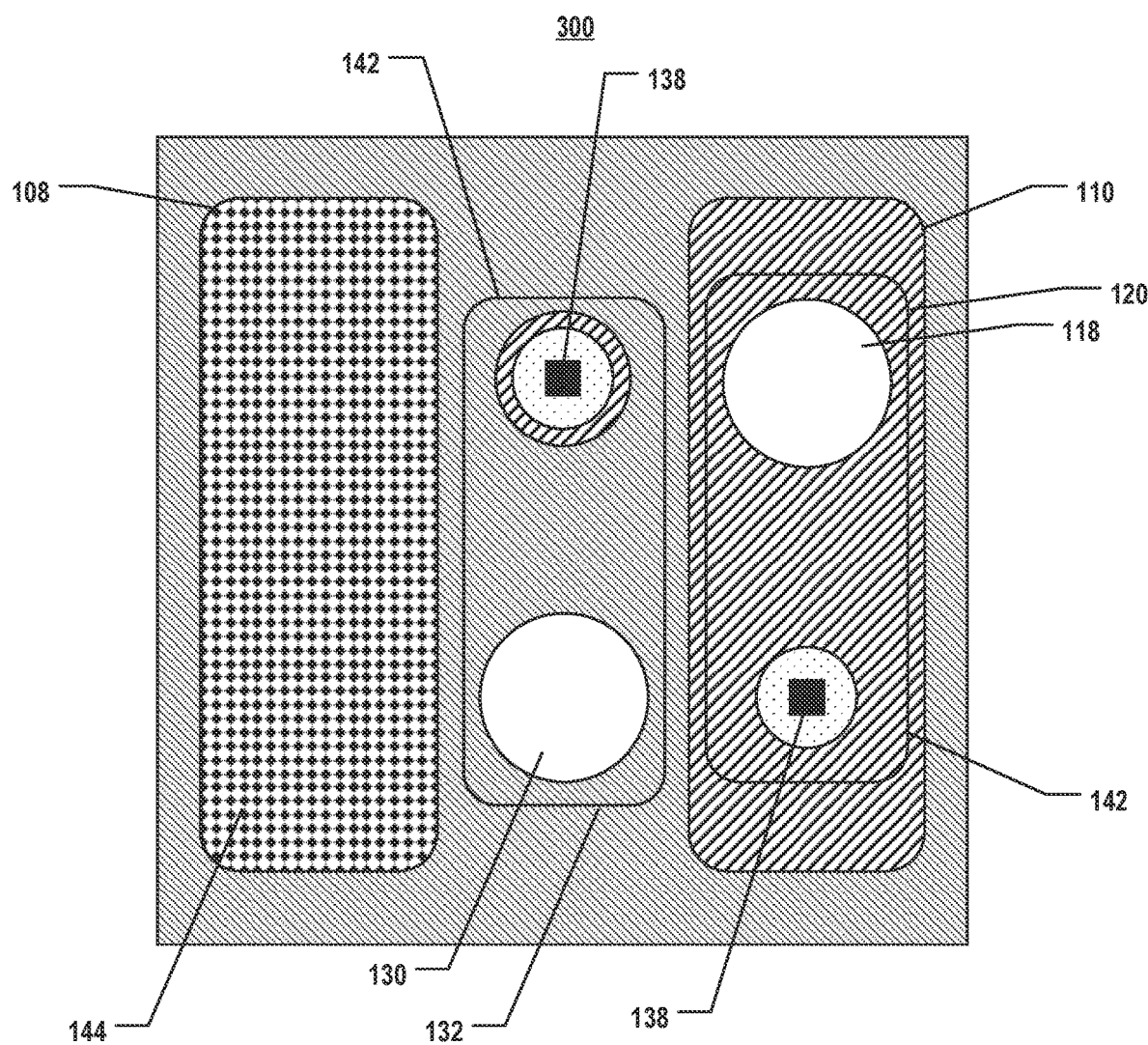
Figure 22:
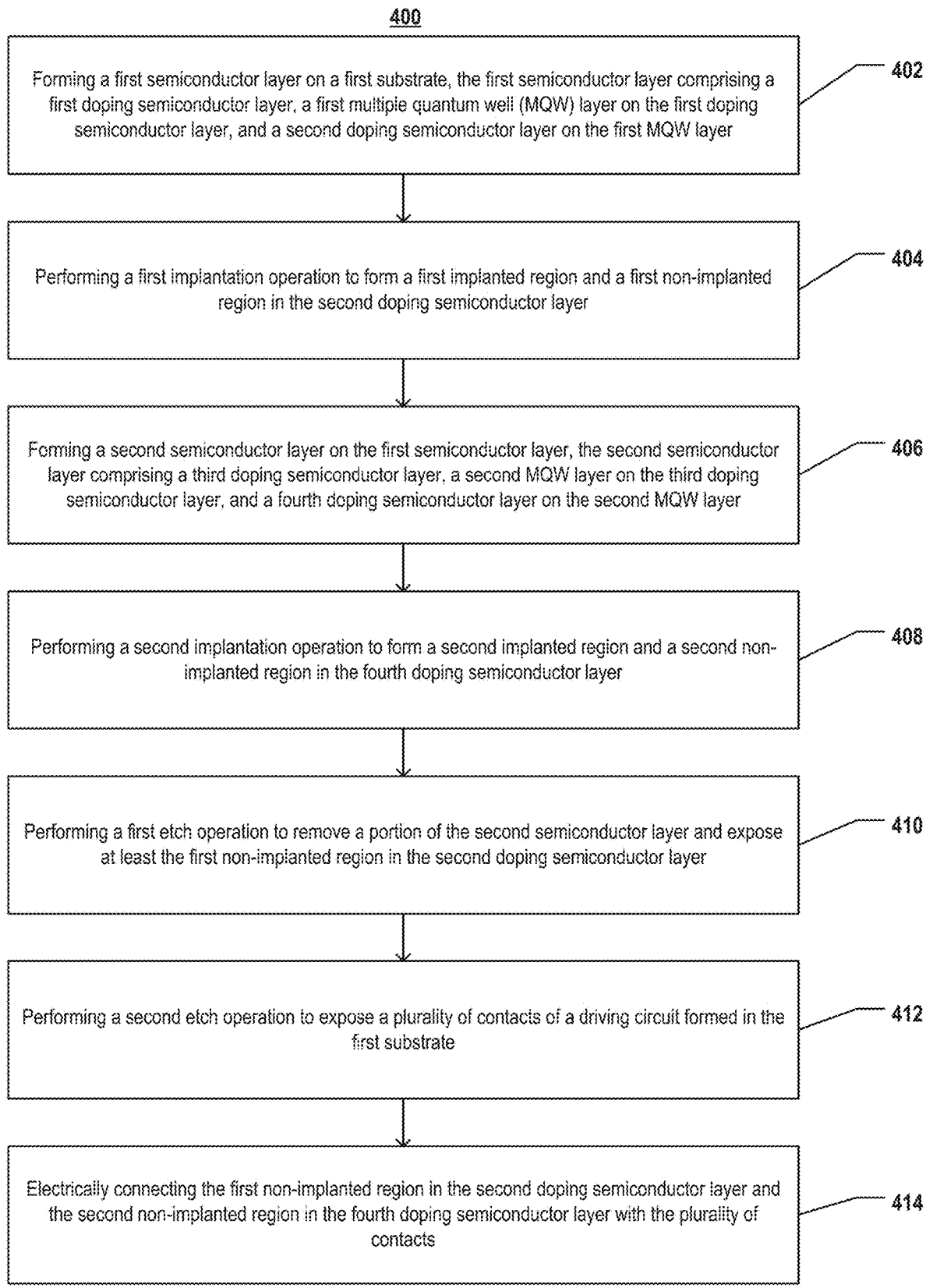
FIG. 22 is a flowchart of an exemplary method for manufacturing a LED structure, according to some implementations of the present disclosure.

Then, as shown in FIGS. 21 and 15A-15C, color conversion layer 144 may be formed on first LED unit 108. FIG. 21 illustrates a top view of LED structure 300 after forming color conversion layer 144. FIG. 15A illustrates a cross section of LED structure 300 along line A-A' in FIG. 21, FIG. 15B illustrates a cross section of LED structure 300 along line B-B' in FIG. 21, and FIG. 15C illustrates a cross section of LED structure 300 along line C-C' in FIG. 21. Color conversion layer 144 may convert light of the first color to a third color. In some implementations, color conversion layer 144 may include phosphor. In some implementations, color conversion layer 144 may include quantum dots. In some implementations, color conversion layer 144 may be formed on first LED unit 108 by printing technology. In some implementations, color conversion layer 144 may be formed on first LED unit 108 by the photolithography process. It is understood that the descriptions of the material and the manufacture method of color conversion layer 144 are merely illustrative and are not limiting, and those skilled in the art can change according to requirements, all of which are within the scope of the present application.

By forming color conversion layer 144 on first LED unit 108 to convert the first color emitted by first LED unit 108 to the third color, LED structure 200 may emit at least three different colors. When individually applying different bias voltages to first LED unit 108, second LED unit 110, and third LED unit 112 (three sub-pixels), the three primary colors, e.g., red, green and blue, may integrally form a full color pixel.

Figure 23:
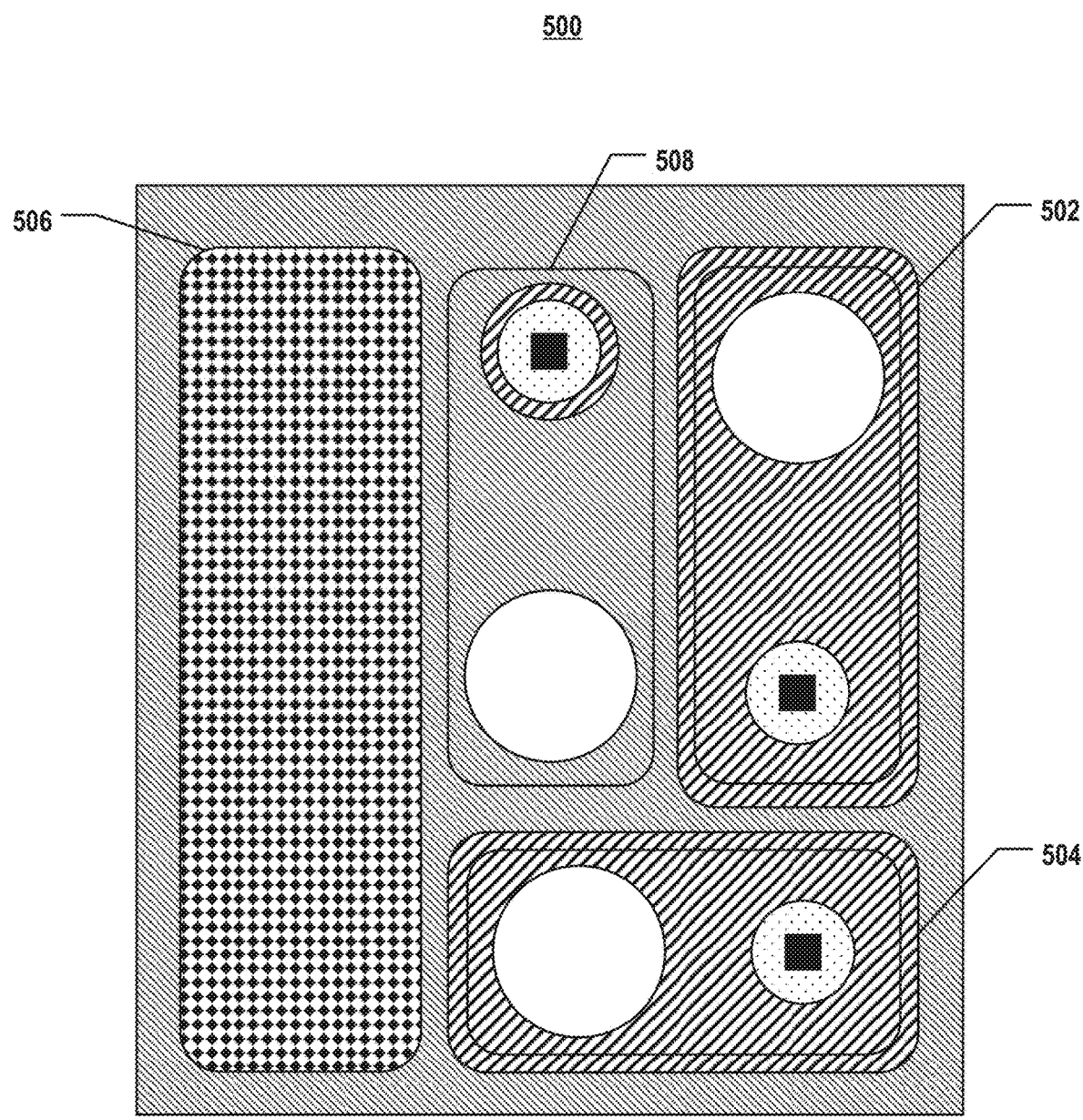
FIGS. 23-24 illustrate top views of exemplary LED structures, according to some implementations of the present disclosure.

FIG. 23 illustrates atop view of an exemplary LED structure 500, according to some implementations of the present disclosure. In the implementation shown in FIG. 23, a full color pixel may include more than three sub-pixels. For example, as shown in FIG. 23, LED structure 500 forms a full color pixel in a display, and LED structure 500 includes four sub-pixels, LED unit 502-508. For example, LED units 502, 504, and 506 may be formed in the first semiconductor layer, and LED unit 508 may be formed in the second semiconductor layer. LED units 502, 504, and 506 may emit blue light, and LED unit 508 may emit green light. Then the color conversion layer may be formed on LED unit 506 to convert the color of LED unit 506 from blue light to red light. Hence, the full color pixel formed by LED structure 500 includes one green sub-pixel, one red sub-pixel, and two blue sub-pixels.

Figure 24:
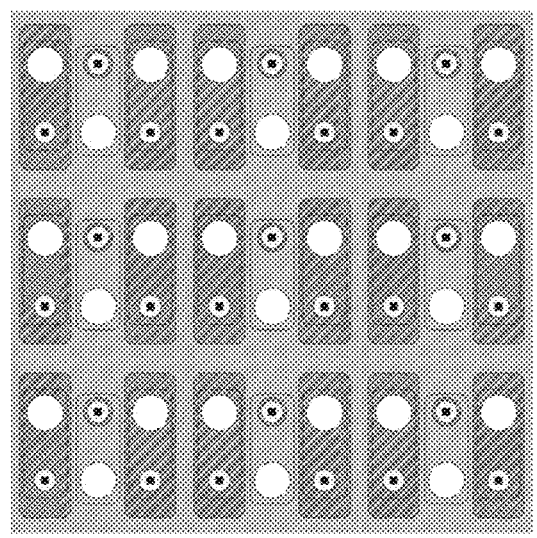
Figure 24:
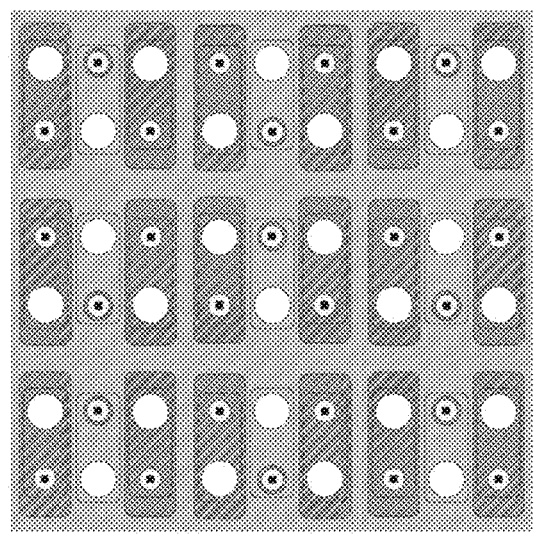
Figure 24:
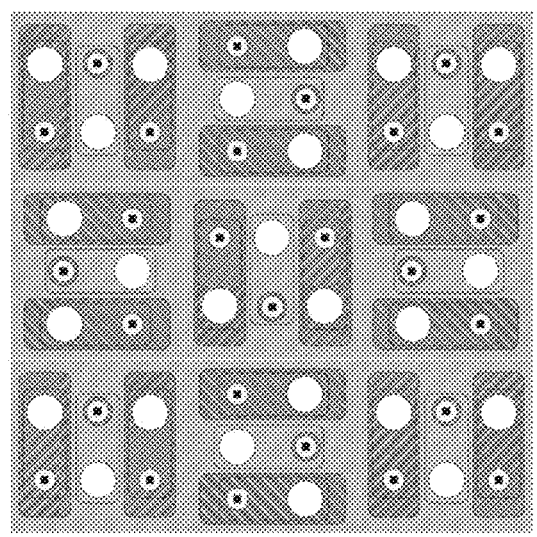

FIG. 24 illustrates a top view of three exemplary LED structures 600, 700 and 800, according to some implementations of the present disclosure. LED structures 600, 700 and 800 each have sub-pixels arranged in a different pattern to form the various pixels in the respective LED structures. As shown in FIG. 24, the arrangement of the sub-pixels in the full color pixel may be various. For example, LED structure 600 includes a plurality of pixels, and each pixel includes three sub-pixels. The arrangement of the sub-pixels in each pixel are repeated in LED structure 600. For another example, LED structure 700 also includes a plurality of pixels, and each pixel also includes three sub-pixels. However, the arrangement of sub-pixels in each pixel is interlaced. More specifically, the arrangement of sub-pixels in adjacent pixels in LED structure 700 rotates 180 degrees. For a further example, LED structure 800 also includes a plurality of pixels, and each pixel also includes three sub-pixels. However, the arrangement of sub-pixels in adjacent pixels in LED structure 800 rotates 90 degrees. It is understood that the arrangements and the number of sub-pixels in a full color pixel or the arrangements of multiple full color pixels in a display are not limiting, and those skilled in the art can make changes according to requirements, all of which are within the scope of the present application.

The present disclosure utilizes first ion-implanted material 120 to isolate first LED unit 108 and second LED unit 110 and define the light emitting area of first LED unit 108 and second LED unit 110. Therefore, the top surface of first semiconductor layer 104 may be kept substantially flat, and second semiconductor layer 106 could be formed or bonded on first semiconductor layer 104. Furthermore, the present disclosure utilizes different materials to form first semiconductor layer 104 and second semiconductor layer 106, and first LED unit 108 and second LED unit 110 may emit light of a first color, and third LED unit 112 may emit light of a second color. Then, color conversion layer 144 is formed on first LED unit 108 to convert the first color emitted by first LED unit 108 to the third color. When applying bias voltages to first LED unit 108, second LED unit 110, and third LED unit 112 (three sub-pixels), the three primary colors. e.g., red, green and blue, may integrally form a full color pixel.

Implementations of the present disclosure include the staking structure of multiple semiconductor layers to manufacture LED units emitting light of at least two colors. The color conversion layer converts on of the at least two colors to the third color, and therefore the LED structure disclosed can achieve full color light emission by multiple LED units while avoiding the drawbacks of mass transfer of the LED units.

According to one aspect of the present disclosure, a LED structure is disclosed. The LED structure includes a substrate, a first semiconductor layer, a second semiconductor layer, and a color conversion layer. The first semiconductor layer is formed on the substrate, and the first semiconductor layer includes a first LED unit and a second LED unit formed therein. The first LED unit and the second LED unit emit light of a first color. The second semiconductor layer is formed above the first semiconductor layer, and the second semiconductor layer includes a third LED unit formed therein. The third LED unit emits light of a second color different from the first color. The color conversion layer is formed on the first LED unit to convert light of the first color to light of a third color different from the first color and the second color.

In some implementations, the first semiconductor layer includes an isolation material formed between the first LED unit and the second LED unit. In some implementations, the third LED unit is formed above the isolation material and is electrically isolated from the first LED unit and the second LED unit.

In some implementations, the light of the first color is blue light, and the light of the second color is green light. In some implementations, the light of the third color is red light.

According to another aspect of the present disclosure, a LED structure is disclosed. The LED structure includes a substrate and a plurality of LED units formed on the substrate. Each LED unit includes a first doping semiconductor layer, a multiple quantum well (MQW) layer formed on the first doping semiconductor layer, and a second doping semiconductor layer formed on the MQW layer. The plurality of LED units include a first LED unit and a second LED unit formed on the substrate and horizontally adjacent to each other. The second doping semiconductor layer of the first LED unit is electrically isolated with the second doping semiconductor layer of the second LED unit by an ion-implanted material formed above the first doping semiconductor layer and the MQW layer. The plurality of LED units further includes a third LED unit formed above the ion-implanted material.

In some implementations, each LED unit further includes a passivation layer formed on the second doping semiconductor layer, and an electrode layer formed on the passivation layer in contact with a portion of the second doping semiconductor layer through a first opening on the passivation layer, and in contact with a contact of a driving circuit formed in the substrate through a second opening.

In some implementations, the second opening of the third LED unit is formed through the first doping semiconductor layer of the third LED unit, the MQW layer of the third LED unit, the second doping semiconductor layer of the third LED unit, and the ion-implanted material between the first LED unit and the second LED unit. In some implementations, top surfaces of the second doping semiconductor layer of the first LED unit, the second doping semiconductor layer of the second LED unit, and the ion-implanted material are substantially coplanar.

In some implementations, the MQW layer and the first doping semiconductor layer of the first LED unit horizontally extend to the MQW layer and the first doping semiconductor layer of the second LED unit. In some implementations, the first LED unit and the second LED unit emit light of a first color, and the third LED unit emits light of a second color different from the first color.

In some implementations, a color conversion layer is formed on the first LED unit to convert the light of the first color to light of a third color different from the first color and the second color. In some implementations, the light of the first color is blue light, the light of the second color is green light, and the light of the third color is red light. In some implementations, the first LED unit, the second LED unit and the third LED unit are separately connected to different contacts of the driving circuit through the electrode layer.

According to a further aspect of the present disclosure, a method for manufacturing a LED structure is disclosed. A first semiconductor layer is formed on a first substrate. The first semiconductor layer includes a first doping semiconductor layer, a first multiple quantum well (MQW) layer on the first doping semiconductor layer, and a second doping semiconductor layer on the first MQW layer. A first implantation operation is performed to form a first implanted region and a first non-implanted region in the second doping semiconductor layer. A second semiconductor layer is formed on the first semiconductor layer. The second semiconductor layer includes a third doping semiconductor layer, a second MQW layer on the third doping semiconductor layer, and a fourth doping semiconductor layer on the second MQW layer. A second implantation operation is performed to form a second implanted region and a second non-implanted region in the fourth doping semiconductor layer. A first etch operation is performed to remove a portion of the second semiconductor layer and expose at least the first non-implanted region in the second doping semiconductor layer. A second etch operation is performed to expose a plurality of contacts of a driving circuit formed in the first substrate. The first non-implanted region in the second doping semiconductor layer and the second non-implanted region in the fourth doping semiconductor layer are electrically connected with the plurality of contacts.

In some implementations, the driving circuit is formed in the first substrate, the first semiconductor layer is formed on a second substrate, the first semiconductor layer is bonded onto the first substrate through a first bonding layer, and the second substrate is removed. In some implementations, the second semiconductor layer is formed on a third substrate, the second semiconductor layer is bonded onto the first semiconductor layer through a second bonding layer, and the third substrate is removed.

In some implementations, the second implantation operation is performed to form the second non-implanted region on the first implanted region. In some implementations, the first etch operation is performed to remove the portion of the second semiconductor layer, expose the first non-implanted region in the second doping semiconductor layer, and expose a portion of the first implanted region in the second doping semiconductor layer above the plurality of contacts.

In some implementations, a passivation layer is formed over the first semiconductor layer and the second semiconductor layer, a portion of the passivation layer is removed to expose the first non-implanted region in the second doping semiconductor layer, the second non-implanted region in the fourth doping semiconductor layer, and the plurality of contacts, and an electrode layer is formed on the passivation layer electrically connecting the first non-implanted region in the second doping semiconductor layer and the second non-implanted region in the fourth doping semiconductor layer with the plurality of contacts.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A light emitting diode (LED) structure, comprising:
    a substrate;
        a first semiconductor layer formed on the substrate, the first semiconductor layer comprising a first LED unit and a second LED unit formed therein, wherein the first LED unit and the second LED unit emit light of a first color;
        a second semiconductor layer formed above the first semiconductor layer, the second semiconductor layer comprising a third LED unit formed therein, wherein the third LED unit emits light of a second color different from the first color,
        wherein each of the first LED unit, the second LED unit, and the third LED unit comprises:
            a first doping semiconductor layer;
            a multiple quantum well (MQW) layer formed on the first doping semiconductor layer; and
            a second doping semiconductor layer formed on the MQW layer,
            wherein an ion-implanted material is formed in the second doping semiconductor layer, the ion-implanted material of the first LED unit extends to the ion-implanted material of the second LED unit, and each of the first LED unit, the second LED unit, and the third LED unit comprises a light emitting area surrounded by the ion-implanted material in the second doping semiconductor layer;
        a passivation layer covering the ion-implanted material and exposing the light emitting area of the first LED unit, the second LED unit, and the third LED unit;
        an electrode layer formed on the passivation layer; and
        a color conversion layer formed on the first LED unit to convert light of the first color to light of a third color different from the first color and the second color,
        wherein the first LED unit, the second LED unit, and the third LED unit are non-overlapping in a top view of the LED structure.

2. The LED structure of claim 1, wherein the first semiconductor layer comprises an isolation material formed between the first LED unit and the second LED unit.

3. The LED structure of claim 2, wherein the third LED unit is formed above the isolation material and is electrically isolated from the first LED unit and the second LED unit.

4. The LED structure of claim 1, wherein the light of the first color is blue light, and the light of the second color is green light.

5. The LED structure of claim 4, wherein the light of the third color is red light.

6. A light emitting diode (LED) structure, comprising:
    a substrate; and
        a plurality of LED units formed on the substrate, each LED unit comprising:
            a first doping semiconductor layer;
            a multiple quantum well (MQW) layer formed on the first doping semiconductor layer; and
            a second doping semiconductor layer formed on the MQW layer, wherein the plurality of LED units comprise a first LED unit and a second LED unit formed on the substrate and horizontally adjacent to each other, wherein the second doping semiconductor layer of the first LED unit is electrically isolated with the second doping semiconductor layer of the second LED unit by an ion-implanted material formed in the second doping semiconductor layer, and the ion-implanted material of the first LED unit extends to the ion-implanted material of the second LED unit, wherein the plurality of LED units further comprises a third LED unit formed above the ion-implanted material, wherein a passivation layer covers the ion-implanted material and exposes the second doping semiconductor layer of the plurality of LED units, wherein an electrode layer is formed on the passivation layer, and wherein the first LED unit, the second LED unit, and the third LED unit are non-overlapping in a top view of the LED structure.

7. The LED structure of claim 6, wherein the electrode layer is in contact with a portion of the second doping semiconductor layer through a first opening on the passivation layer, and in contact with a contact of a driving circuit formed in the substrate through a second opening.

8. The LED structure of claim 7, wherein a second opening of the third LED unit is formed through the first doping semiconductor layer of the third LED unit, the MQW layer of the third LED unit, the second doping semiconductor layer of the third LED unit, and the ion-implanted material between the first LED unit and the second LED unit.

9. The LED structure of claim 7, wherein the first LED unit, the second LED unit and the third LED unit are separately connected to different contacts of the driving circuit through the electrode layer.

10. The LED structure of claim 6, wherein top surfaces of the second doping semiconductor layer of the first LED unit, the second doping semiconductor layer of the second LED unit, and the ion-implanted material are substantially coplanar.

11. The LED structure of claim 6, wherein the first LED unit and the second LED unit emit light of a first color, and the third LED unit emits light of a second color different from the first color.

12. The LED structure of claim 11, further comprising:
a color conversion layer formed on the first LED unit to convert the light of the first color to light of a third color different from the first color and the second color.

13. The LED structure of claim 12, wherein the light of the first color is blue light, the light of the second color is green light, and the light of the third color is red light.

* * * * *